(12) United States Patent
Pasca et al.

(10) Patent No.: US 10,732,932 B2
(45) Date of Patent: Aug. 4, 2020

(54) METHODS FOR USING A MULTIPLIER CIRCUIT TO SUPPORT MULTIPLE SUB-MULTIPLICATIONS USING BIT CORRECTION AND EXTENSION

(71) Applicant: Intel Corporation, Santa Clara, CA (US)

(72) Inventors: Bogdan Pasca, Toulouse (FR); Martin Langhammer, Alderbury (GB); Sergey Gribok, Santa Clara, CA (US); Gregg William Baeckler, San Jose, CA (US)

(73) Assignee: Intel Corporation, San Jose, CA (US)

( * ) Notice: Subject to any disclaimer, the term of this patent is extended or adjusted under 35 U.S.C. 154(b) by 0 days.

(21) Appl. No.: 16/231,170

(22) Filed: Dec. 21, 2018

(65) Prior Publication Data

US 2020/0142671 A1 May 7, 2020

(51) Int. Cl.
*G06F 7/523* (2006.01)
*H03K 19/177* (2020.01)

(52) U.S. Cl.
CPC ............ *G06F 7/523* (2013.01); *H03K 19/177* (2013.01)

(58) Field of Classification Search
CPC .............................. G06F 7/523; H03K 19/177
USPC ........................................................ 708/625
See application file for complete search history.

(56) References Cited

U.S. PATENT DOCUMENTS 3,434,114 A 3/1969 Arulpragasam et al.
4,893,268 A 1/1990 Denman et al.
5,515,520 A 5/1996 Hatta et al.
5,696,711 A 12/1997 Makineni
5,909,385 A 6/1999 Nishiyama et al.
5,917,741 A 6/1999 Ng
(Continued)

FOREIGN PATENT DOCUMENTS

WO 01-09712 2/2001
WO 2013-148619 10/2013

OTHER PUBLICATIONS

S.F. Oberman, "Floating Point Division and Square Rood Algorithms and Implementations in the AMD-K7 Microprocessor", Proc. 14th Symp. Computer Arithmetic (ARITH14), pp. 1106-1115, Apr. 1999.

(Continued)

*Primary Examiner* — Tan V Mai
(74) *Attorney, Agent, or Firm* — Treyz Law Group, P.C.; Jason Tsai

(57) ABSTRACT

Integrated circuits with digital signal processing (DSP) blocks are provided. A DSP block may include one or more large multiplier circuits. A large multiplier circuit such as an 18×18 multiplier circuit may be used to support two or more smaller multiplication operations such as two 8×8 integer multiplications or two 9×9 integer multiplications. To implement the two 8×8 or 9×9 unsigned/signed multiplications, the 18×18 multiplier may be configured to support two 8×8 multiplications with one shared operand, two 6×6 multiplications without any shared operand, or two 7×7 multiplications without any shared operand. Any potential overlap of partial product terms may be subtracted out using correction logic. The multiplication of the remaining most significant bits can be computed using associated multiplier extension logic and appended to the other least significant bits using merging logic.

22 Claims, 17 Drawing Sheets

(56) References Cited

U.S. PATENT DOCUMENTS

| | | | |
|---|---|---|---|
| 6,480,872 | B1 | 12/2002 | Choquette |
| 7,318,080 | B2* | 1/2008 | Berkeman ............. G06F 7/5324 708/625 |
| 7,948,267 | B1 | 5/2011 | Mauer et al. |
| 8,195,735 | B2* | 6/2012 | Hansen ................. G06F 7/5338 708/514 |
| 8,706,790 | B1 | 4/2014 | Langhammer |
| 8,949,298 | B1 | 2/2015 | Langhammer |
| 9,098,332 | B1 | 8/2015 | Langhammer |
| 9,104,474 | B2 | 8/2015 | Kaul et al. |
| 9,189,200 | B1 | 11/2015 | Langhammer |
| 10,042,607 | B2 | 8/2018 | Langhammer |
| 10,467,324 | B2* | 11/2019 | Chung .................... G06F 17/16 |
| 2002/0194240 | A1 | 12/2002 | Pangal et al. |
| 2004/0254971 | A1 | 12/2004 | Dirker et al. |
| 2006/0117080 | A1 | 6/2006 | Lutz et al. |
| 2010/0023568 | A1 | 1/2010 | Hickey et al. |
| 2013/0007084 | A1 | 1/2013 | Nystad |
| 2014/0188968 | A1 | 7/2014 | Kaul et al. |
| 2015/0169289 | A1 | 6/2015 | Tannenbaum et al. |
| 2016/0062954 | A1 | 3/2016 | Ruff et al. |
| 2019/0042198 | A1 | 2/2019 | Langhammer et al. |

OTHER PUBLICATIONS

K. Manolopoulos, D/ Reisis, V. Chouliaras, "An efficient multiple percision floating-pont multipler", Proc. 18th IEEE Int. Conf. Electron. Circuits Sust., pp. 153-156, 2011.

H/ Thapliyal, H.R. Arabnia, A.P. Vinod, "Combined integer and floating point multiplication architecture (CIFM) for FPGAs and its reversible logic implementation", Proceedings MWSCAS 2006, Aug. 2006.

* cited by examiner

FIG. 5A

| Bit Weight | 35 | 34 | 33 | 32 | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|---|---|---|---|
| CONFIGURATION 1 — operation (P+Q)R | | | | | | | | | | | | | | | | | | | | | | | | | | | | | | | | | | | | |
| P | | | | | | | | | | | | | | | | | | | b7 | b6 | b5 | b4 | b3 | b2 | b1 | b0 | c7 | c7 | c7 | c7 | c7 | c7 | c7 | c2 | c1 | c0 |
| Q | | | | | | | | | | | | | | | | | | | c7 | c7 | c7 | c7 | c7 | c7 | c7 | c7 | 0 | 0 | 0 | 0 | 0 | 0 | c3 | c2 | c1 | c0 |
| R | | | | | | | | | | | | | a7 | a7 | a7 | a7 | a7 | a7 | a7 | a7 | a7 | a7 | a7 | a7 | a7 | a7 | a7 | a7 | a6 | a5 | a4 | a3 | a2 | a1 | a0 | 0 |
| CONFIGURATION 2 — operation (P−Q)R | | | | | | | | | | | | | | | | | | | | | | | | | | | | | | | | | | | | |
| P | | | | | | | | | | | | | | | | | | | b7 | b6 | b5 | b4 | b3 | b2 | b1 | b0 | c7 | c7 | c7 | c7 | c7 | c7 | c7 | c2 | c1 | c0 |
| Q | | | | | | | | | | | | | | | | | | | 0 | 0 | 0 | 0 | 0 | 0 | 0 | c7 | 0 | 0 | 0 | 0 | 0 | 0 | c3 | c2 | c1 | c0 |
| R | | | | | | | | | | | | | a7 | a7 | a7 | a7 | a7 | a7 | a7 | a7 | a7 | a7 | a7 | a7 | a7 | a7 | a7 | a7 | a6 | a5 | a4 | a3 | a2 | a1 | a0 | 0 |

Internal Multiplier Signals:

| Bit Weight | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|
| O=PxQ | 0 | 0 | 0 | 0 | o35 | o34 | o33 | o32 | o31 | o30 | o29 | o28 | o27 | o26 | o25 | o24 | |
| Error bit | | | | | | | | | | | | | | | | E | − |
| N | n8 | n8 | n7 | n6 | n5 | n4 | n3 | n2 | n1 | n0 | | | | | | | + |
| S | s3 | s2 | s1 | s0 | | | | | | | | | | | | | + |

FIG. 6C

| Bit Weight | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| | | | | | z11 | z10 | z9 | z8 | z7 | z6 | z5 | z4 | z3 | z2 | z1 | z0 |
| O=PxQ | | | | | o11 | o10 | o9 | o8 | o7 | o6 | o5 | o4 | o3 | o2 | o1 | o0 |
| M | m8 | m8 | m7 | m6 | m5 | m4 | m3 | m2 | m1 | m0 | | | | | | |
| R | r3 | r2 | r1 | r0 | | | | | | | | | | | | |

METHODS FOR USING A MULTIPLIER CIRCUIT TO SUPPORT MULTIPLE SUB-MULTIPLICATIONS USING BIT CORRECTION AND EXTENSION

BACKGROUND

This invention relates generally to integrated circuits and, in particular, to integrated circuits with multiplier circuitry.

Programmable logic devices (PLDs) include logic circuitry such as look-up tables (LUTs) and adder based logic that are designed to allow a user to customize the circuitry to the user's particular needs. This configurable logic is typically divided into individual logic circuits that are referred to as logic elements (LEs). The LEs may be grouped together to form larger logic blocks referred to as logic array blocks (LABs) that may be configured to share the same resources (e.g., registers and memory). In addition to this configurable logic, PLDs also include programmable interconnect or routing circuitry that is used to connect the inputs and outputs of the LEs and LABs. The combination of this programmable logic and routing circuitry is referred to as soft logic.

Besides soft logic, PLDs may also include specialized processing blocks that implements specific predefined logic functions and thus cannot be configured by the user. Such specialized processing blocks may include a concentration of circuitry on a PLD that has been partly or fully hardwired to perform one or more specific tasks, such as a logical or a mathematical operation. Examples of structures that are commonly implemented in such specialized processing blocks include: multipliers, arithmetic logic units (ALUs), barrel-shifters, various memory elements (such as FIFO/LIFO/SIPO/RAM/ROM/CAM blocks and register files), logic AND/NAND/OR/NOR arrays, etc., or combinations thereof.

One particularly useful type of specialized processing block that has been provided on PLDs is a digital signal processing (DSP) block. A conventional DSP block includes two 18-by-18 multipliers, which can be combined with other internal circuitry to form a larger 27-by-27 multiplier. The 27-by-27 multiplier is used as part of an IEEE 754 single precision floating-point multiplier, which requires 24 bits of precision.

Recent developments in artificial intelligence such as advancements in machine learning and deep learning involve training and inference, which have necessitated a much higher density of multiplications, especially at smaller precisions (i.e., multiplications with operands having less than 10 bits). As an example, machine learning inference might require performing a number of 8×8 multiplication operations. A conventional 18×18 multiplier is, however, only capable of supporting a single 8×8 multiplication.

It is within this context that the embodiments described herein arise.

BRIEF DESCRIPTION OF THE DRAWINGS

FIG. 5A is a diagram showing the allocation of input bits for an 18×18 multiplier that is configured to support two signed 8×8 multiplications with a shared input operand in accordance with an embodiment.

FIGS. 6B and 6C are diagrams showing the alignment of additional shifted product terms that needs to be combined with the output of the 18×18 multiplier in accordance with an embodiment.

DETAILED DESCRIPTION

The present embodiments relate to a programmable integrated circuit and in particular, how multiple smaller multipliers (sometimes referred to as sub-multipliers) can be extracted from a larger multiplier within the programmable integrated circuit.

For example, an 18×18 multiplier may be configured to support two 8×8 multiplications while optionally using soft logic to remove/correct potential errors caused by overlapping product terms. For unsigned multipliers, a subset of an erroneous portion is calculated separately and then subtracted out. For signed multipliers, a pre-adder may be used in conjunction with bit correction logic or smaller outputs of the 18×18 multiplier can be combined with bits generated from extension logic via a decomposition method. Implementing at least two 8×8 multipliers using only one 18×18 multiplier is smaller, faster, and consumes less power than implementing two 8×8 multipliers inside one 18×27 multiplier, which is substantially more power hungry and costly. An 18×18 multiplier is less than two-thirds the size of an 18×27 multiplier. The ability to extract multiple 8×8 multiplications from the smaller 18×18 multiplier will result in dramatically improved computational and power density.

It will be recognized by one skilled in the art, that the present exemplary embodiments may be practiced without some or all of these specific details. In other instances, well-known operations have not been described in detail in order not to unnecessarily obscure the present embodiments.

Figure 1:
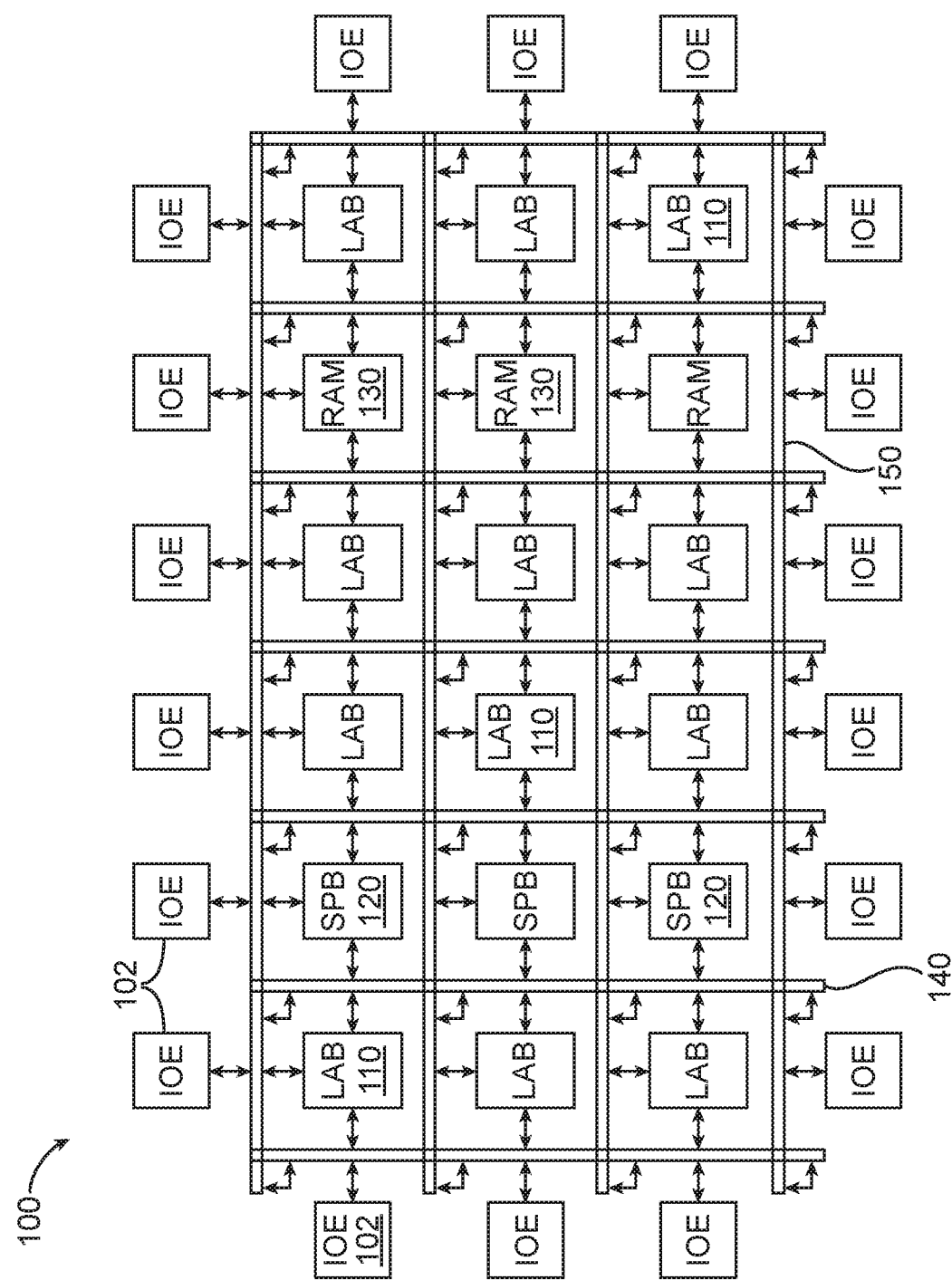
FIG. 1 is a diagram of an illustrative programmable integrated circuit in accordance with an embodiment.

An illustrative embodiment of an integrated circuit such as programmable logic device (PLD) 100 is shown in FIG. 1. As shown in FIG. 1, programmable logic device 100 may include a two-dimensional array of functional blocks, including logic array blocks (LABs) 110 and other functional blocks, such as random access memory (RAM) blocks 130 and specialized processing blocks such as specialized processing blocks (SPB) 120 that are partly or fully hardwired to perform one or more specific tasks such as mathematical/arithmetic operations. Functional blocks such as LABs 110 may include smaller programmable regions (e.g., logic elements, configurable logic blocks, or adaptive logic modules) that receive input signals and perform custom functions on the input signals to produce output signals. Device 100 may further include programmable routing fabric that is used to interconnect LABs 110 with RAM blocks 130 and specialized processing blocks 120 (sometimes referred to as digital signal processing or DSP blocks). The combination of the programmable logic and routing fabric is sometimes referred to as "soft" logic, whereas the DSP blocks are sometimes referred to as "hard" logic. In general, device 100 may also include other types of hard logic circuitry.

Programmable logic device 100 may contain programmable memory elements for configuring the soft logic. Memory elements may be loaded with configuration data (also called programming data) using input/output elements (IOEs) 102. Once loaded, the memory elements provide corresponding static control signals that control the operation of one or more LABs 110, programmable routing fabric, and optionally SPBs 120 or RAMs 130. In a typical scenario, the outputs of the loaded memory elements are applied to the gates of metal-oxide-semiconductor transistors (e.g., pass transistors) to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, mechanical memory devices (e.g., including localized mechanical resonators), mechanically operated RAM (MORAM), programmable metallization cells (PMCs), conductive-bridging RAM (CBRAM), combinations of these structures, etc. Because the memory elements are loaded with configuration data during programming, the memory elements are sometimes referred to as configuration memory, configuration RAM (CRAM), configuration memory elements, or programmable memory elements.

In addition, programmable logic device 100 may have input/output elements (IOEs) 102 for driving signals off of device 100 and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The routing fabric (sometimes referred to as programmable interconnect circuitry) on PLD 100 may be provided in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, routing wires may be shorter than the entire length of the routing channel. A length L wire may span L functional blocks. For example, a length four wire may span four functional blocks. Length four wires in a horizontal routing channel may be referred to as "H4" wires, whereas length four wires in a vertical routing channel may be referred to as "V4" wires.

Furthermore, it should be understood that the present embodiments may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
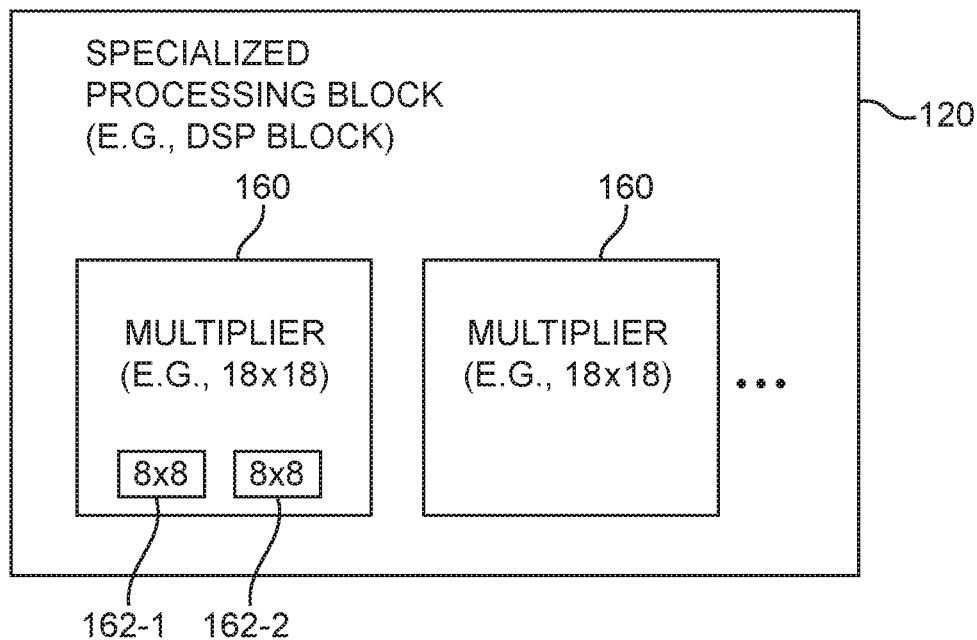
FIG. 2 is a diagram of an illustrative specialized processing block in accordance with an embodiment.

FIG. 2 is a diagram of a specialized processing block 120 (sometimes referred to as a digital signal processing block or "DSP" block). DSP block 120 (sometimes also referred to as a multiply-accumulate block) may include a concentration of circuitry that has been partially or fully hardwired to perform one or more specific tasks, such as a logical or a mathematical operation (e.g., a multiply operation, an add operation, a sum-of-products operation, a dot-vector operation, etc.). DSP block 120 may also contain one or more specialized structures such as an array of configurable storage elements.

Examples of structures that may be implemented in DSP block 120 include: multipliers, adders, accumulators, arithmetic logic units (ALUs), barrel-shifters, various memory elements (such as FIFO/LIFO/SIPO/RAM/ROM/CAM blocks and register files), logic AND/NAND/OR/NOR arrays, etc., or combinations thereof. Storage elements within DSP block 120 may serve different purposes than configuration memory. For instance, storage elements within DSP block 120 may store coefficients for implementing FIR filters, Fourier transforms (e.g., fast Fourier transforms), or other polynomial functions. Alternatively, storage elements within DSP block 120 may be used to pipeline a critical path or to synchronize data before it is processed.

As shown in FIG. 2, DSP block 120 may include at least first and second multiplier circuits 160. As an example, multiplier circuits 160 may each be an 18-by-18 multiplier circuit, two of which can be combined into a larger 27-by-27 multiplier to support an IEEE 754 single precision floating-point multiplication operation (as an example). If desired, DSP block 120 may include additional multipliers 160.

In accordance with an embodiment, each multiplier 160 may be configured to support at least two smaller multiplication operations (see, e.g., first sub-multiplier 162-1 and second sub-multiplier 162-2). Each of the smaller multiplier circuits 162-1 and 162-2 may be an 8×8 multiplier (as an example). Configurations in which the larger 18×18 multiplier 160 is configured to support two 8×8 integer multipliers may be described herein as an example, but is not intended to limit the scope of the present embodiments. If desired, multiplier 160 may optionally be configured to support two or more 6×6 multiplications, two or more 7×7 multiplications, two or more 9×9 multiplications, or any suitable number of multiplications involving input operands less than or equal to 10 bits.

Figure 3:
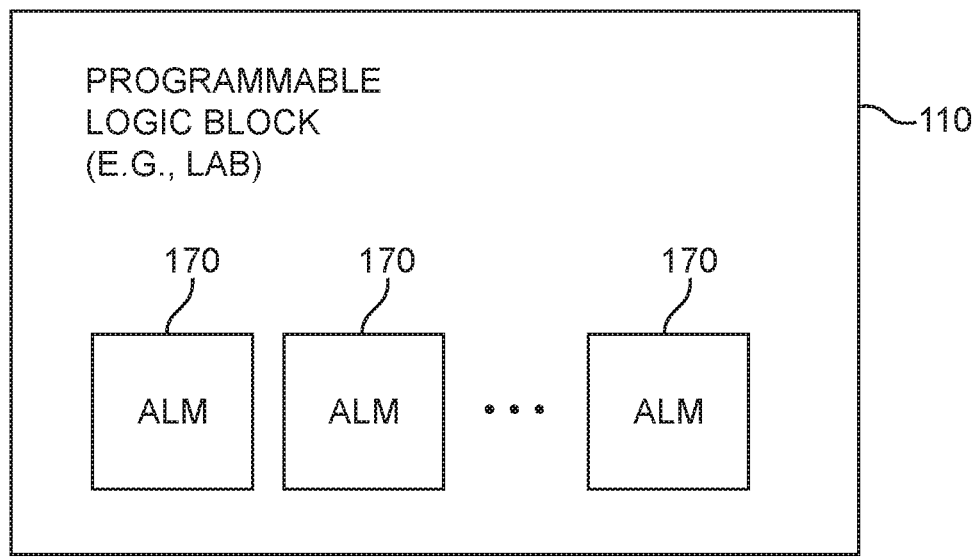
FIG. 3 is a diagram of an illustrative programmable logic block in accordance with an embodiment.

FIG. 3 is a diagram of an illustrative programmable logic block such as LAB 110. LAB 110 may include a smaller subset of LABs operable to access memory and that is therefore sometimes referred to as memory LABs ("MLABs"). LAB 110 may have associated input selection circuitry and output selection and driver circuitry. The input selection circuitry may include LAB input multiplexers (LIMs) configured to select one or more of the input signals to provide to programmable logic block 110. The output selection and driver circuitry may include driver input multiplexers (DIMs) that can be used to select signals from a horizontal channel, a vertical channel, and local outputs and to drive wires, which originate in that logic block 110 and route to other logic blocks.

As shown in FIG. 3, LAB 110 may include smaller regions of programmable logic that include combinational logic. The smaller programmable logic regions 170 within each programmable logic region 110 are sometimes referred to as adaptive logic modules (ALMs) or logic elements (LEs). Logic modules 170 may include lookup table and register circuitry and may receive the input signals that are selected by the input selection circuitry and may perform custom functions on the input signals to produce output signals. The input signals received by each logic module 170 may overlap with input signal portions received by other logic modules 170 (e.g., some of the input signals received by a first logic region 170 may also be received by a second logic region 170). There may be any suitable number of ALMs 170 within logic block 110. The term "soft logic" or "programmable logic" may refer to some collection of ALMs 170 and programmable interconnect/routing circuitry on device 100 that is used to carry out the desired arithmetic functions.

As described above, multipliers 160 within DSP block 120 (FIG. 2) may be used to support multiple smaller multiplications, which can help increase the functional density of DSP block 120. The configuration in which DSP block 120 includes two 18×18 multipliers are sometimes described herein as an example. In general, any number of smaller sub-multipliers can be extracted from the two larger 18×18 multiplier circuits optionally using one or more ALMs. Most of these cases will be described using a single 18×18 multiplier, which is only a portion of DSP block 120 (e.g., half of a DSP block).

Figure 4A:
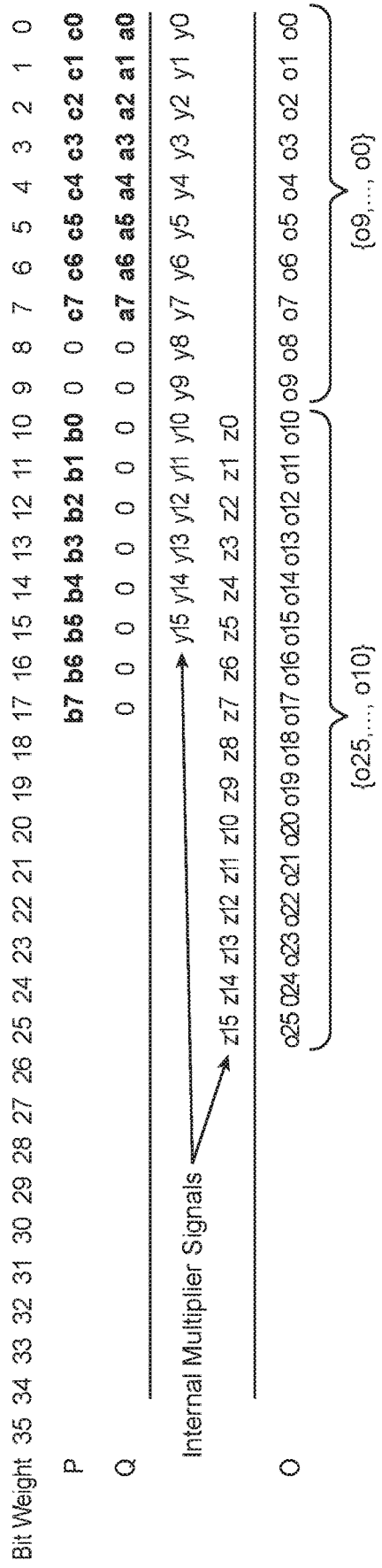
FIG. 4A is a diagram showing the allocation of input bits for an 18×18 multiplier that is configured to support two unsigned 8×8 multiplications with a shared input operand in accordance with an embodiment.

In one suitable arrangement, two unsigned 8×8 smaller multipliers with a shared operand may be extracted from an 18×18 multiplier using some post processing correction. FIG. 4A is a diagram showing the allocation of input bits for an unsigned 18×18 multiplier that is configured to support two unsigned 8×8 multiplications with a shared input operand. As shown in FIG. 4A, the unsigned 18×18 multiplier has a first input P and a second input Q that are each capable of receiving up to 18 bits (i.e., from bit weight or index 0 to 17). To implement two 8×8 multiplications with one common input operand, indices [7:0] of Q are configured to receive input signals A (i.e., bits [a7:a0]), indices [17:10] of P are configured to receive input signals B (i.e., bits [b7:b0] while indices [7:0] of P are configured to receive input signals C (i.e., bits [c7:c0]). The remaining indices [9:8] of P and indices [17:8] of Q are populated with zeroes. Inputs A, B, and C are each 8-bit unsigned integers, and input A is the common operand.

The product O, which is equal to P*Q, is available at the output of the 18×18 multiplier. Using the information in output O, it is possible to recover Y (where Y=A*C) and Z (where Z=A*B), which are the two desired products available as inner DSP block signals. Note that Y is equal to $\{y15, \ldots, y0\}$ and Z is equal to $\{z15, \ldots, z0\}$. The Y bits $\{y15, \ldots, y0\}$ may sometimes be referred to as a first "logical" multiplier product, whereas the Z bits $\{z15, \ldots, z0\}$ may sometimes be referred to as a second "logical" multiplier product. The term "logical" refers to the fact that they represent multiplier signals internal to the DSP block.

The lower bits of Y can be recovered directly for the lower portion of output O:

$$\{y9, \ldots, y0\} = \{o9, \ldots, o0\} \quad (1)$$

In order to recover the upper bits of Y $\{y15, \ldots, y10\}$, it can be observed that:

$$\{o25, \ldots, o10\} = \{y15, \ldots, y10\} + \{z15, \ldots, z0\} \quad (2)$$

which is equivalent to:

$$\{o25, \ldots, o10\} = \{z15, \ldots, z6, y15, \ldots, y10\} + \{z5, \ldots, z0\} \quad (3)$$

Consequently, to correctly recover the upper bits of Z and Y that we still need:

$$\{z15, \ldots, z6, y15, \ldots, y10\} = \{o25, \ldots, o10\} - \{z5, \ldots, z0\} \quad (4)$$

Bits $\{o25, \ldots, o10\}$ are available at the output of the 18×18 multiplier. Correction bits $\{z5, \ldots, z0\}$ can be easily computed using an auxiliary 6×6 soft-logic multiplier configured to computed only the 6 least significant bits (LSBs) of product $\{a5, \ldots, a0\}*\{b5, \ldots, b0\}$. Normally, a full 6×6 multiplier will output 12 bits, but the auxiliary soft-logic multiplier used here will only compute the 6 LSBs without calculating any of the upper bits. Configured as such, the auxiliary 6×6 multiplier (e.g., a multiplier implemented using one or more ALMs) is sometimes referred to as a "partial LSB multiplier" or an "LSB-based multiplier." As an example, the partial LSB multiplier may be implemented using modulo arithmetic by computing [A*B mod(2^6)].

Alternatively, a full 6×6 multiplier can be used while simply dropping the 6 most significant bits (MSBs) to obtain {z5, . . . , z0}.

Once the 6×6 soft logic multiplier has computed the correction value {z5, . . . , z0}, a subtraction is performed in accordance with equation (4) above to obtain {z15, . . . , z6} and {y15, . . . , y10}. Thereafter, Y can be reconstructed by appending the newly computed bits {y15, . . . , y10} with bits {y9, . . . , y0}, which are simply equal to {o9, . . . , o0} as described above. On the other hand, Z can be reconstructed by appending the newly computed bits {z15, . . . , z6} with bits {z5, . . . , z0}, which are calculated by the LSB soft logic multiplier.

Figure 4B:
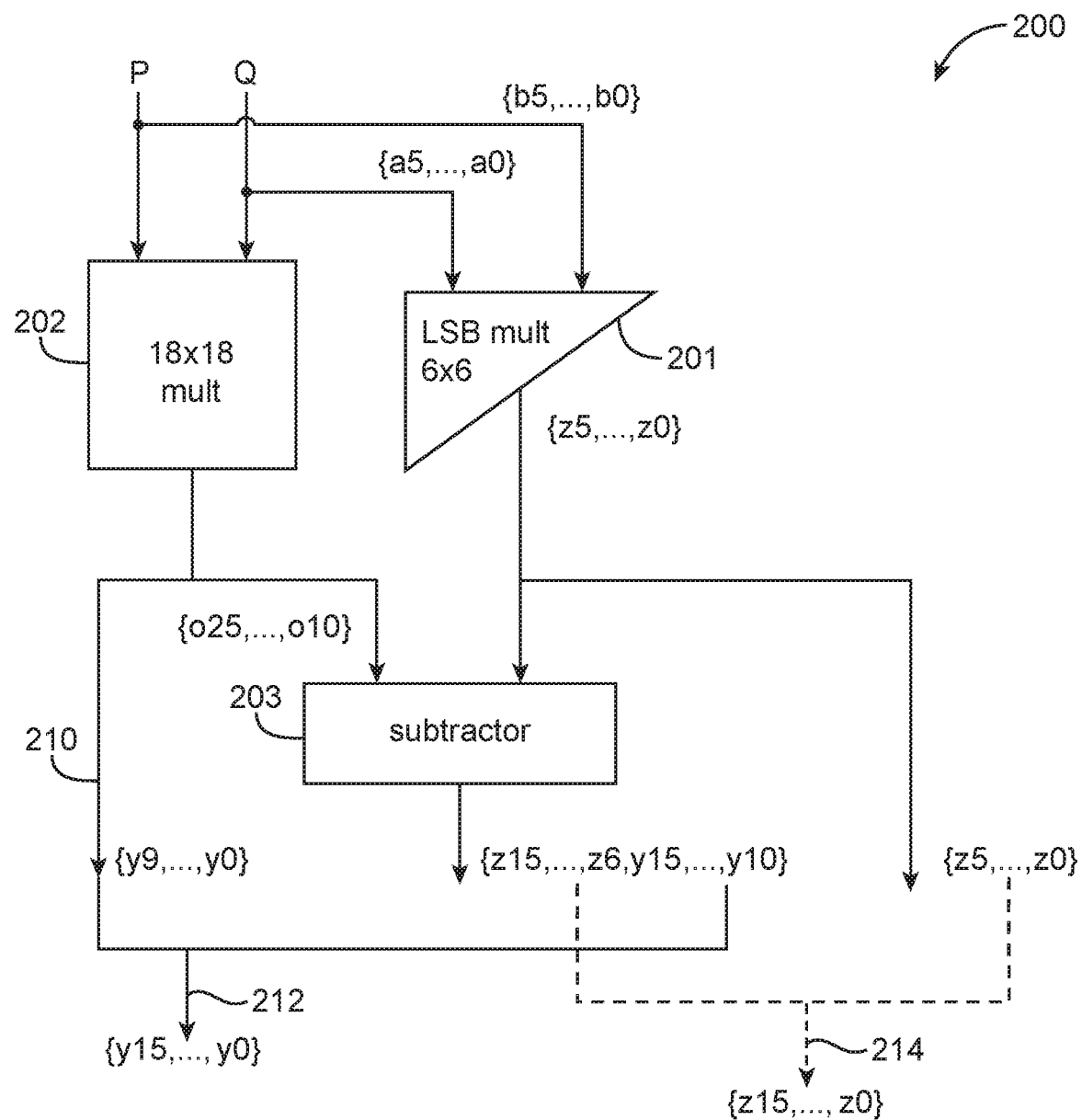
FIG. 4B is a diagram showing the overall architecture of the multiplier circuitry of FIG. 4A in accordance with an embodiment.

The overall architecture of this type of multiplier circuitry is shown in FIG. 4B (see, e.g., multiplier circuitry 200). As shown in FIG. 4B, the prepared input vectors P and Q are fed into an 18×18 unsigned multiplier 202, which generate output bits {o25, . . . , o0} as shown in FIG. 4A. The bottom 10 bits of the output {o9, . . . , o0} can directly be identified as {y9, . . . , y0} and can be forwarded directly to the output, as indicated by path 210.

In parallel with 18×18 multiplier 202, a partial LSB soft logic 6×6 multiplier 201 implements LSB multiplication {a5, . . . , a0}*{b5, . . . , b0}[5:0] to compute {z5, . . . , z0}. Multiplier circuitry 200 may further include a subtraction circuit 203 that subtracts the newly computed correction bits {z5, . . . , z0} from {o25, . . . , o10} to generate the top bits of Y {y15, . . . , y10} and also the top bits of Z {z15, . . . , z6}. The Y bits can be appended together (as indicated by path 212), whereas the Z bit can be appended together (as indicated by path 214).

The correction method described above where {z5, . . . , z0} is subtracted from all of {o25, . . . , o10} fully corrects for Z, but this need not be the case. In certain embodiments, a smaller subtraction might be performed to only subtract the LSBs. Performing a small subtraction might not necessarily remove all the errors in Z but it can help save power and cost (e.g., some error might still exist at the final multiplier output even after the subtraction).

In the example above, multiplier 202 is unsigned and the 8×8 sub-multiplications will be unsigned. In another suitable variation, P and Q might both be signed such that input operand A is signed while operands B and C are both unsigned (e.g., B should be 0 sign extended). In yet another suitable variation, 0 is signed (i.e., input operand A is signed) and P is unsigned such that B and C are both unsigned. In yet another suitable variation, P and Q are both signed such that input operands A and B are both signed while input operand C is unsigned.

In another suitable embodiment, two signed 8×8 smaller multipliers with a shared operand may be extracted from an 18×18 multiplier using some post processing correction. FIG. 5A is a diagram showing the allocation of input bits for a signed 18×18 multiplier that is configured to support two signed 8×8 multiplications with a shared input operand. As shown in FIG. 5A, the signed 18×18 multiplier has a first input that receives a result from a pre-adder (which combines inputs P and Q) and a second input R. Input bits A {a7, . . . , a0} are connected to multiplier input R directly.

The pre-adder has a first input P that receives {b7, . . . , b0} and {c7, . . . , c0}, with two c7 in between as sign extensions. The pre-adder has a second input Q. There are two possible configurations for connecting Q. In a first configuration, Q will receive {c7,c7,c7,c7,c7,c7,c7,c7, 10'b0} and the pre-adder is configured to add. Thus, the multiplier output will be equal to O=(P+Q)*R. In a second configuration, Q will receive {7'b0,c7,10'b0} and the pre-adder is configured to subtract. In this case, the multiplier output will be equal to O=(P−Q)*R. In either configuration, the adding or subtracting of sign extension bit c7 in Q will emulate the sign extension of C, assuming C is a signed number in two's complement. Inputs A, B, and C are each 8-bit signed integers, and input A is the common operand.

Using the information in output O, it is possible to recover Y (where Y=A*C) and Z (where Z=A*B), which are the two desired products available as inner multiplier signals. Once again, the lower bits of Y can be recovered directly for the lower portion of output O:

$$\{y9, \ldots, y0\} = \{o9, \ldots, o0\} \quad (5)$$

As shown in FIG. 5A, bits {y15, . . . , y10} overlap with {z5, . . . , z0} to yield the upper output bits (e.g., the upper Y MSBs pollute the lower Z LSBs at the output and thus needs to be corrected). Bits {z5, . . . , z0} can be easily computed using an auxiliary 6×6 soft-logic multiplier (e.g., a partial LSB-only multiplier) as follows:

$$\{z5, \ldots, z0\} = \{a5, \ldots, a0\} * \{b5, \ldots, b0\}[5:0] \quad (6)$$

Similar to equation (4) above, the remaining bits of Y and Z still has to be calculated, but with a caveat: bit y15 at the output of the subtractor has to be connected back as inputs to the subtractor. The arithmetic operation is as follows:

$$\{z15, \ldots, z6, y115, \ldots, y10\} = \{o25, \ldots, o10\} - \{y15, y15, y15, y15, y15, y15, y15, y15, y15, z5 \ldots, z0\} \quad (7)$$

Bits {o25, . . . , o10} are available at the output of the 18×18 multiplier. Bits {z5, . . . , z0} can be easily computed using an auxiliary 6×6 soft-logic multiplier using equation (6).

Figure 5B:
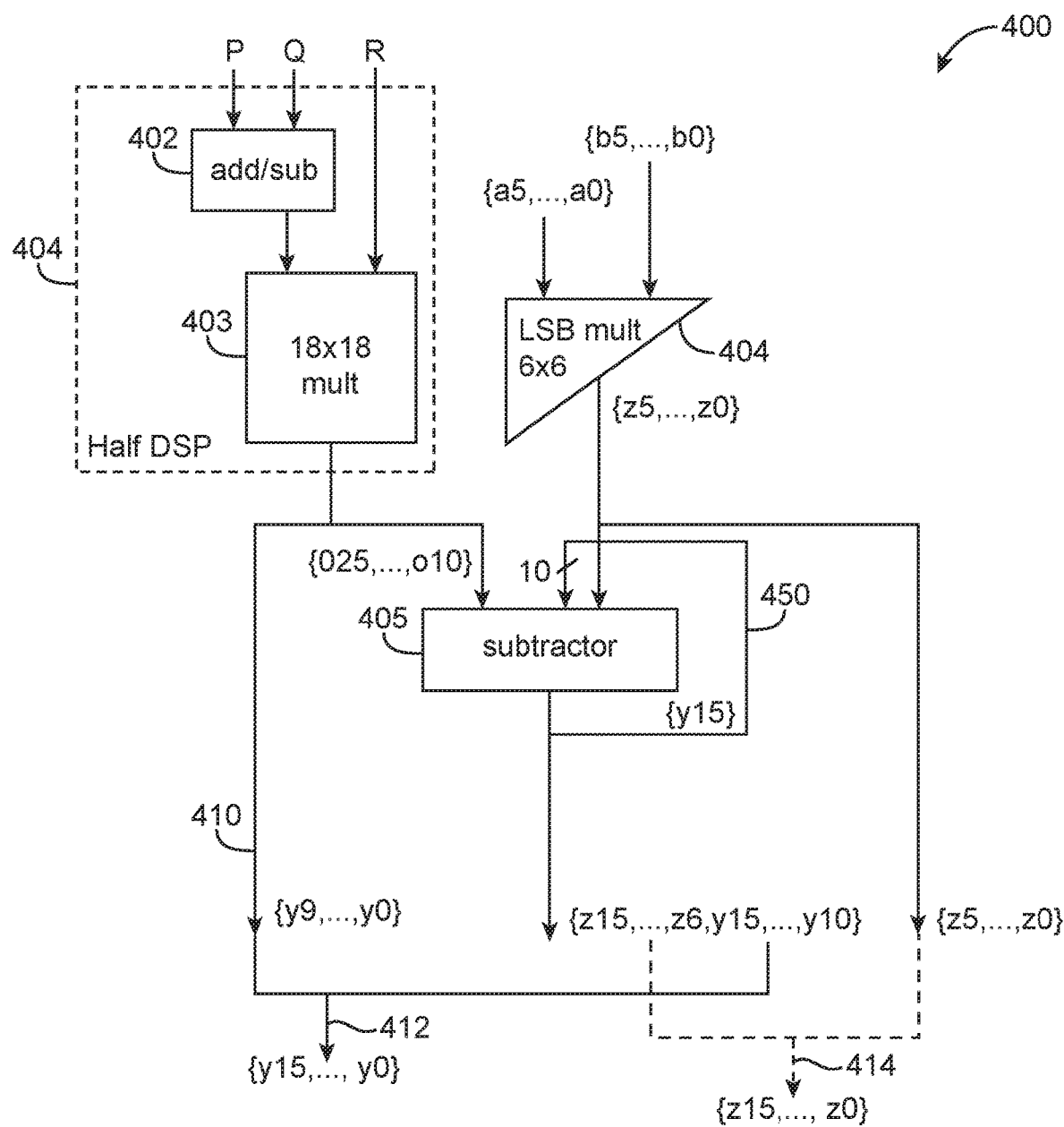
FIG. 5B is a diagram showing one implementation of the overall architecture of the multiplier circuitry of FIG. 5A in accordance with an embodiment.

The overall architecture of this type of multiplier circuitry is shown in FIG. 5B (see, e.g., multiplier circuitry 400). As shown in FIG. 5B, the prepared input vectors P and Q are fed into pre-adder circuit 402, which can be configured as an adder or a subtractor. Multiplier circuitry 400 may also include an 18×18 signed multiplier 403 having a first input that receives a signal from pre-adder 402 and a second input that receives vector R. In examples where a DSP block includes two 18×18 multipliers, circuits 402 and 403 may form half of the DSP block (see block 401). Multiplier 403 generates output bits {o25, . . . , o0}. The bottom 10 bits of the output {o9, . . . , o0} can directly be identified as {y9, . . . , y0} and can be forwarded directly to the output, as indicated by path 410.

Figure 5C:
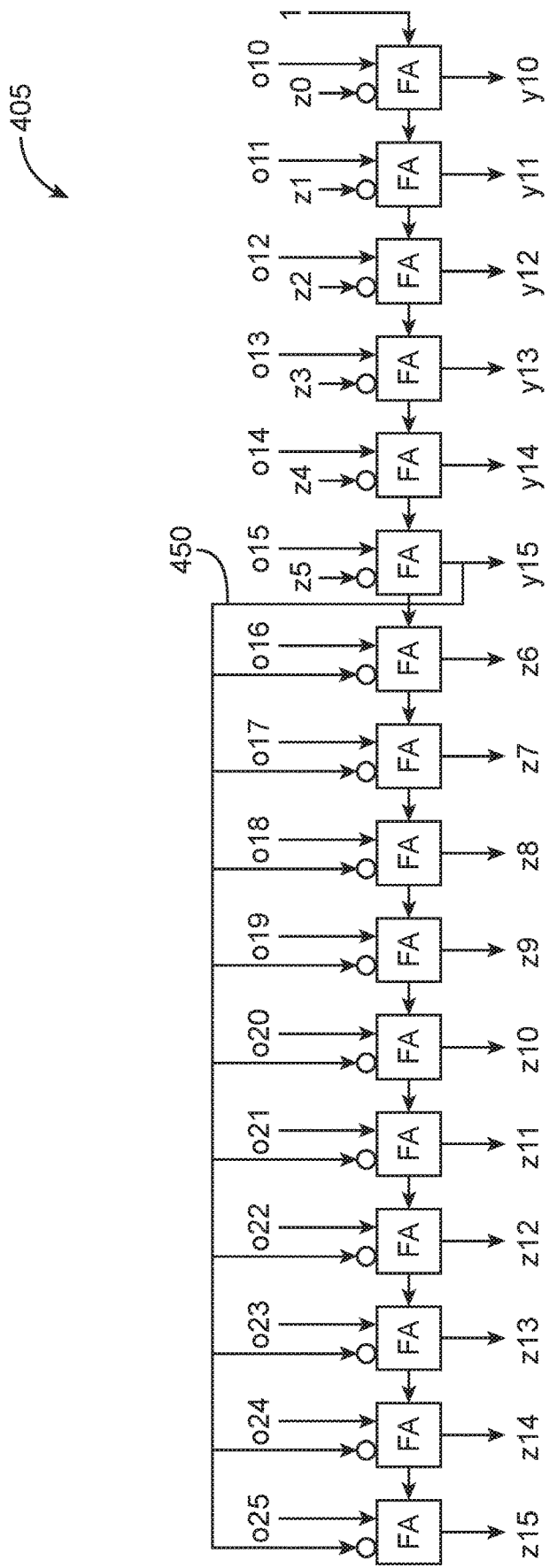
FIG. 5C is a diagram showing how a subtraction circuit within the multiplier architecture can generate output bits, one of which can be recirculated as inputs in accordance with an embodiment.

In parallel with 18×18 multiplier 403, a partial LSB soft logic 6×6 multiplier 404 implements LSB multiplication {a5, . . . , a0}*{b5, . . . , b0}[5:0] to compute {z5, . . . , z0}. Multiplier circuitry 400 may further include a subtraction circuit 405 that subtracts the newly computed bits {z5, . . . , z0} from {o25, . . . , o10}. The subtraction progress from right to left to produce the 6 LSBs {y15, . . . , y10}. Once y15 is produced, it is recirculated or fed back as an input vector to subtractor 405. FIG. 5C is a diagram showing details of subtraction circuit 405. As shown in FIG. 5C, subtractor 405 includes a chain of full adders with a carry one input at the first stage. The full adders (FA) have a first input that receives {o25, . . . , o10} and a second inverted input for implementing the two's complement subtraction. In particular, note that output y15 is recirculated back as inputs to the ten upper full adders, as indicated by feedforward path 450.

Subtraction circuit 405 will then proceed to generate bits {z15, . . . , z6}. Referring back to FIG. 5B, the Y bits can be appended together (as indicated by path 412), whereas the Z bit can be appended together (as indicated by path 414).

The equation of FIG. 7 can alternatively be expressed as a chaining of operations:

$$\{cOut, y15, \ldots, y10\} = \{0, o15, \ldots, o10\} + \{0, !z5, \ldots, !z0\} + 1 \quad (8)$$

Followed by:

$$\{z15, \ldots, z6\} = \{o25, o24, o23, o22, o21, o20, o19, o18, o17, o16\} + \{!y15, !y15, !y15, !y15, !y15, !y15, !y15, !y15, !y15, !y15, !y15\} + cOut \quad (9)$$

Figure 5D:
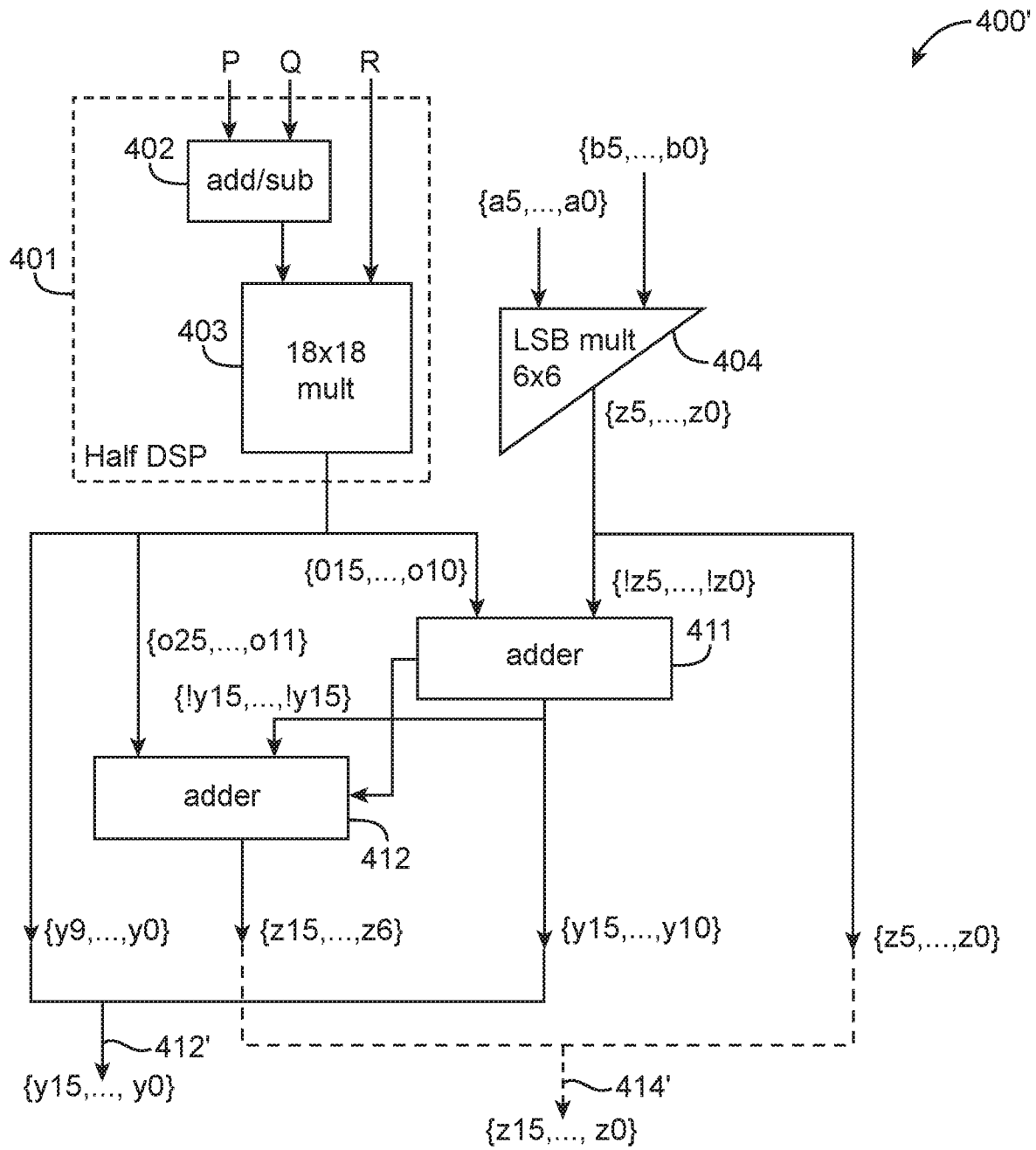
FIG. 5D is a diagram showing another implementation of the overall architecture of the multiplier circuitry of FIG. 5A in accordance with an embodiment.

This finding leads to an alternative implementing of multiplier circuitry 400' that avoids having to recirculate the output of the subtractor back on its input (see, e.g., the alternative multiplier architecture of FIG. 5D). As shown in FIG. 5D, multiplier circuitry 400' replaces subtraction circuit 405 with a set of adder circuits 411 and 412. Adder 411 is configured as a 6-bit adder with a carry out that implements equation (8). Adder 412 is configured as a 10-bit adder with a carry in that implements equation (9). Arranged in this way, adder 411 will output $\{y15, \ldots, y10\}$ while adder 412 will output $\{z15, \ldots, z6\}$. The carry out bit of adder 412 can be ignored. The Y bits can be appended together (as indicated by path 412'), whereas the Z bit can be appended together (as indicated by path 414').

In accordance with yet another suitable arrangement, two signed 8×8 smaller multipliers with no common operands may be extracted from an 18×18 multiplier using bit extension logic. In particular, the 18×18 multiplier and the associated extension logic can be used to implemented two products G=A*B and H=C*D, whereas A, B, C, and D are each 8-bit signed integers.

In particular, inputs A, B, C, and D may each be decomposed into two parts: an upper portion including the 2 MSBs and a lower portion including the 6 LSBs. The lower portion may be unsigned, whereas the upper portion may have a signed extension. The product G=A*B may be expressed as follows:

$$G = (\{a7, a6\}2^6 + \{a5, \ldots, a0\}) * (\{b7, b6\}2^6 + \{b5, \ldots, b0\}) = \{a7, a6\}\{b7, b6\}2^{12} + (\{a5, \ldots, a0\}*\{b7, b6\} + \{b5, \ldots, b0\}*\{a7, a6\})2^6 + \{a5, \ldots, a0\}*\{b5, \ldots, b0\} = S*2^{12} + N*2^6 + Z \quad (10)$$

where S is equal to $\{a7, a6\}\{b7, b6\}$, where N is equal to $(\{a5, \ldots, a0\}*\{b7, b6\} + \{b5, \ldots, b0\}*\{a7, a6\})$, and where Z is equal to $\{a5, \ldots, a0\}*\{b5, \ldots, b0\}$.

Similarly, the product H=C+D can be expressed as follows:

$$H = (\{c7, c6\}2^6 + \{c5, \ldots, c0\}) * (\{d7, d6\}2^6 + \{d5, \ldots, d0\}) = \{c7, c6\}\{d7, d6\}2^{12} + (\{c5, \ldots, c0\}*\{d7, d6\} + \{d5, \ldots, d0\}*\{c7, c6\})2^6 + \{c5, \ldots, c0\}*\{d5, \ldots, d0\} = R*2^{12} + M*2^6 + Y \quad (11)$$

where R is equal to $\{c7, c6\}\{d7, d6\}$, where M is equal to $(\{c5, \ldots, c0\}*\{d7, d6\} + \{d5, \ldots, d0\}*\{c7, c6\})$, and where Y is equal to $\{c5, \ldots, c0\}*\{d5, \ldots, d0\}$.

Figure 6A:
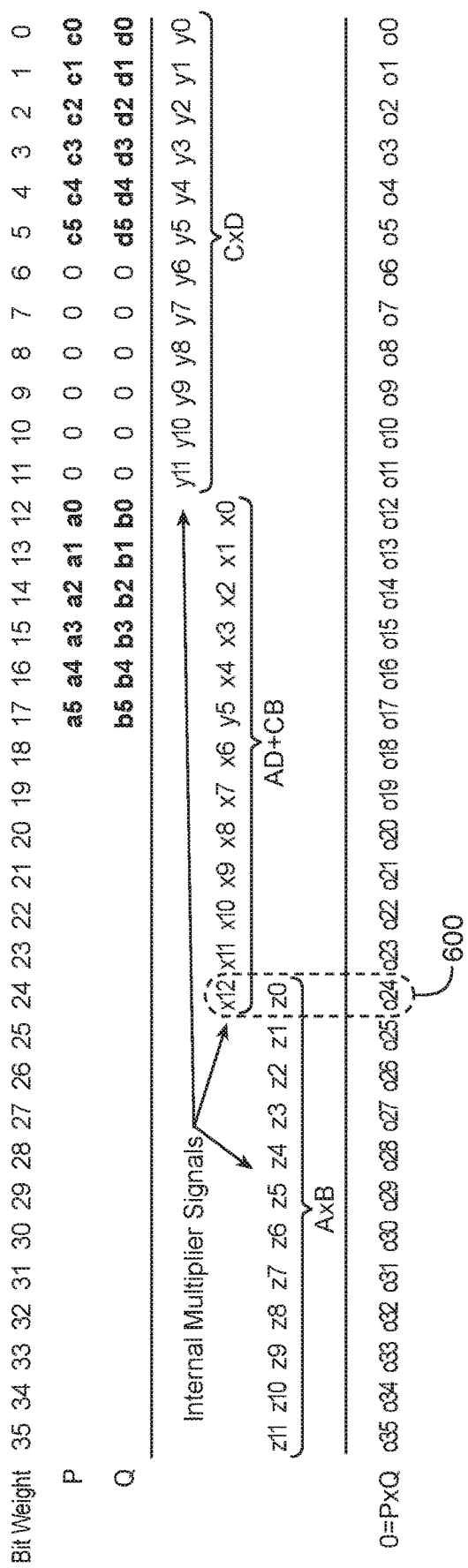
FIG. 6A is a diagram showing the allocation of input bits for an 18×18 multiplier, which is configured to perform unsigned 6×6 multiplications, the output of which can be combined with bits generated from associated extension logic to support two signed 8×8 multiplications with no common input operands in accordance with an embodiment.

Computing Y and Z in equations (10) and (11) requires two 6-bit unsigned multiplications $\{a5, \ldots, a0\}*\{b5, \ldots, b0\}$ and $\{c5, \ldots, c0\}*\{d5, \ldots, d0\}$, which can be computed using an 18×18 multiplier configured as an unsigned multiplier together with some correction logic. FIG. 6A is a diagram showing the allocation of input bits for an unsigned 18×18 multiplier. As shown in FIG. 6A, the unsigned 18×18 multiplier has a first input P and a second input Q that are each capable of receiving up to 18 bits (i.e., from bit weight or index 0 to 17). In particular, indices [17:12] of P are configured to receive $\{a5, \ldots, a0\}$, indices [5:0] of P are configured to receive $\{c5, \ldots, c0\}$, indices [17:12] of Q are configured to receive $\{b5, \ldots, b0\}$, and indices [5:0] of Q are configured to receive $\{d5, \ldots, d0\}$. The remaining indices [11:6] of P and Q are populated with zeroes.

The output O of the 18×18 multiplier will be equal to P*Q and has the following expression:

$$O = P*Q = (\{a5, \ldots, a0\}*2^{12} + \{c5, \ldots, c0\}) * (\{b5, \ldots, b0\}*2^{12} + \{d5, \ldots, d0\}) = \{a5, \ldots, a0\}*\{b5, \ldots, b0\}*2^{24} + (\{a5, \ldots, a0\}*\{d5, \ldots, d0\} + \{c5, \ldots, c0\}*\{b5, \ldots, b0\})*2^{12} + \{c5, \ldots, c0\}*\{d5, \ldots, d0\} = Z*2^{24} + X*2^{12} + Y \quad (12)$$

where X is equal to $(\{a5, \ldots, a0\}*\{d5, \ldots, d0\} + \{c5, \ldots, c0\}*\{b5, \ldots, b0\})$.

Terms Z and Y can be extracted from multiplier output O. Product Y can be extracted directly from output O (i.e., $Y = \{o11, \ldots, o0\}$. As shown in overlapping region 600, Z may have been polluted by the MSB of X, which is equal to (A*D+C*B). To correct for this possible pollution, the LSB of Z can first be computed as follows:

$$z0 = a0*b0 = \{a0 \text{ AND } b0\} \quad (13)$$

As shown in equation 13, a single bit multiplication can simply be implemented using a logic AND gate. An error bit can then be computed as follows:

$$E = (z0 \text{ XOR } o24) \quad (14)$$

where E is computed by taking the logic exclusive OR function of z0 and o24. The error bit can then be subtracted from Z to obtain the correct value of Z:

$$Z = \{o35, \ldots, o24\} - E \quad (15)$$

Now that Y and Z have been obtained, the final product of the wider 8×8 multiplications of G and H can be assembled. The upper signed results of $S = \{a7, a6\}*\{b7, b6\}$ and $R = \{c7, c6\}\{d7, d6\}$ can be easily calculated using table lookup (e.g., using one or more lookup tables within one or more ALMs). The four sign by unsigned values $\{a7, a6\}*\{b5, \ldots, b0\}$, $\{b7, b6\}*\{a5, \ldots, a0\}$, $\{c7, c6\}*\{d5, \ldots, d0\}$, and $\{d7, d6\}*\{c5, \ldots, c0\}$ can also be coded into soft logic. Terms $\{a7, a6\}*\{b5, \ldots, b0\}$ and $\{b7, b6\}*\{a5, \ldots, a0\}$ can be added together using soft logic to produce N (see equation 10), whereas terms $\{c7, c6\}*\{d5, \ldots, d0\}$ and $\{d7, d6\}*\{c5, \ldots, c0\}$ can be added together using soft logic to produce M (see equation 11).

The alignment of these various partial product terms for computing the final values G and H are shown in FIGS. 6B and 6C. As shown in FIG. 6B, error bit E may be subtracted from $\{o35, \ldots, o24\}$ to obtain Z, which can then be summed with sign extended versions of N and S computed in soft logic to calculate the final result G. As shown in FIG. 6C, Y (which is simply equal to $\{o11, \ldots, o0\}$) may be summed with sign extended versions of M and R computed in soft logic to calculate the final result H. The combination of the error-corrected unsigned Z with at least partially signed product terms N and S to compute G and the combination of unsigned Y with at least partially signed product terms M and R may be referred to conceptually as "signed multiplier extension."

Figure 6D:
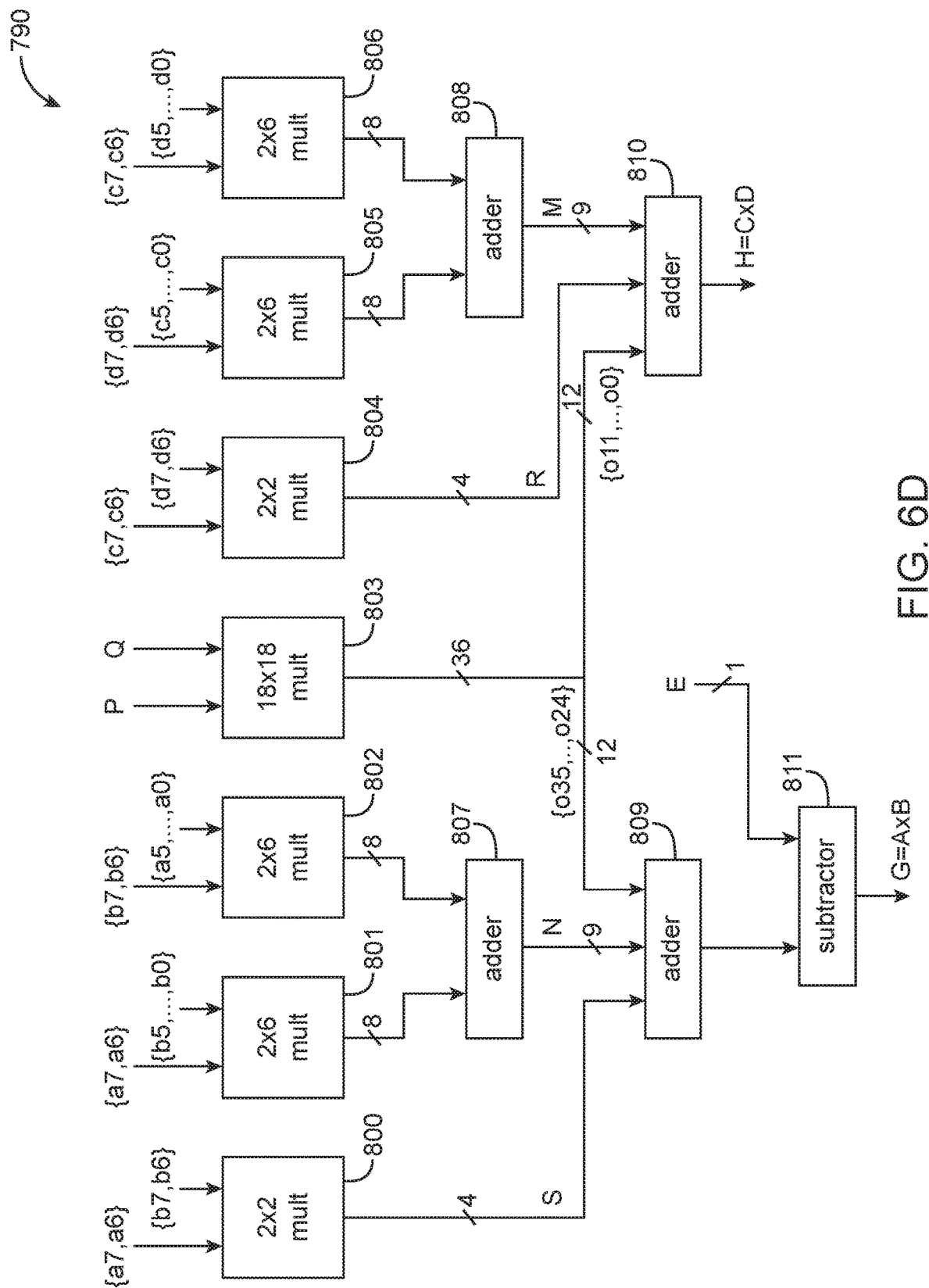
FIG. 6D is a diagram showing the overall architecture of the multiplier circuitry of the type shown in connection with FIGS. 6A-6C in accordance with an embodiment.

The full architecture of this type of multiplier circuitry is shown in FIG. 6D. As shown in FIG. 6D, multiplier circuitry 790 uses two 2×2 multipliers 800 and 804 to compute S and R, respectively. Multipliers 800 and 804 may be implemented by table lookup.

The 2×6 multiplier circuits 801, 802, 805, and 806 may be implemented using at most one ripple-carry addition (or subtraction). If the G and H multiplications are unsigned, then the 2-bit input vectors (i.e., $\{a7, a6\}$ or $\{b7, b6\}$) will either be 0, 1, 2, or 3. The resulting products can therefore be implemented as addition of [(bit_1*K)&0+(bit_0)*K], where bit_1 and bit_0 are the corresponding bits of the 2-bit vector and where K represents the 6-bit unsigned value (e.g., {a5, . . . , a0} or {b5, . . . , b0}). The symbol "&" here represents bit concatenation. If the G and H multiplications are signed, then the 2-bit vector can either be −2 ("10" in binary), −1 ("11" in binary), 0 ("00" in binary), or 1 ("01" in binary).

In this case, the multiplication is implemented as a subtraction [bit_0*K−bit_1K&0]. Multipliers 800, 801, 802, 804, 805, and 806 are sometimes referred to collectively as multiplier extension logic. If desired, 18×18 multiplier 803 and the associated multiplier extension logic might both be signed or might both be unsigned.

Adder circuits 807 and 808 are full-blown adders. Adder circuits 809 and 810 can be two-operand additions since S does not overlap with {o35, . . . , o24} and can therefore be concatenated directly on top of {o35, . . . , o24} and since R does not overlap with {o11, . . . , o0} and can therefore be concatenated directly on top of {o11, . . . , o0}. In other words, S is aligned with {o35, . . . , o24} while R is aligned with {o11, . . . , o0}. The error bit E is subtracted from the result output from adder 809 using subtraction circuit 811 to generate final output G. Final product H is provided at the output of adder 810.

In the example where a DSP block has two 18×18 multipliers, it is possible to obtain two 36 bit results, which contain four 6×6 unsigned results (one of them with potential error), the eight 2×6 signed by unsigned values, two error bits, and four bit extensions. Each type of value can be summed separately. In case of a larger dot product such as DOT32, eight DSP blocks would be required. Similarly, each type of partial result can be summed separately. All partial sums can then be added in a single stage to create the small respective precisions, which large adder precisions are required only at the end. This bit extension and multiplier decomposition technique can be optionally combined with the embodiments of FIGS. 4 and 5 to more efficiently implement larger multiplier circuitry.

Figure 7A:
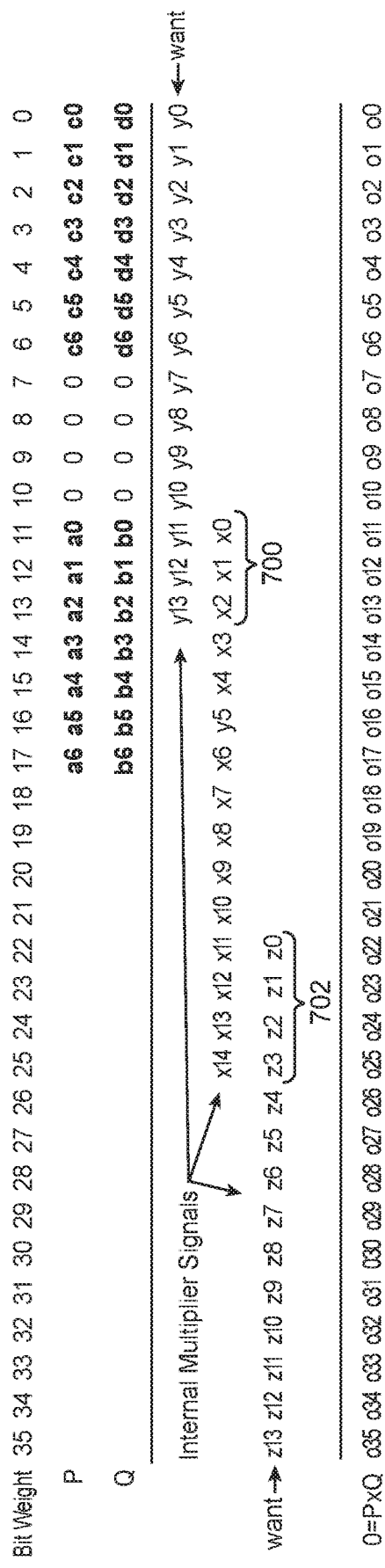
FIG. 7A is a diagram showing the allocation of input bits for an 18×18 multiplier, which is configured to perform unsigned 7×7 multiplications, the output of which can be combined with bits generated from associated extension logic to support two 8×8 multiplications with no common input operands in accordance with an embodiment.

FIG. 7A shows another suitable variation of the multiplier circuitry of FIG. 6D where a 18×18 multiplier is used to compute G'=A*B and H'=C*D, where A, B, C, and D are each 8-bit signed integers, and where inputs A, B, C, and D are each be decomposed into two parts: an upper portion including 1 MSB and a lower portion including the 7 LSBs. The lower portion may be unsigned, whereas the upper MSB portion may be signed. The product G'=A*B may be expressed as follows:

$$G'=(\{a7\}2^7+\{a6,\ldots,a0\})*(\{b7\}2^7+\{b6,\ldots,b0\})=\{a7\}\{b7\}2^{14}+(\{a6,\ldots,a0\}*\{b7\}+\{b6,\ldots,b0\}*\{a7\})2^7+\{a6,\ldots,a0\}*\{b6,\ldots,b0\}=S'*2^{14}+N'*2^7+Z' \quad (16)$$

where S' is equal to {a7}{b7}, where N' is equal to ({a6, . . . , a0}*{b7}+{b6, . . . , b0}*{a7}), and where Z' is equal to {a6, . . . , a0}*{b6, . . . , b0}.

Similarly, the product H'=C*D can be expressed as follows:

$$H'=(\{c7\}2^7+\{c6,\ldots,c0\})*(\{d7\}2^7+\{d6,\ldots,d0\})=\{c7\}\{d7\}2^{14}+(\{c6,\ldots,c0\}*\{d7\}+\{d6,\ldots,d0\}*\{c7\})2^7+\{c6,\ldots,c0\}*\{d6,\ldots,d0\}=R'*2^{14}+M'*2^7+Y' \quad (17)$$

where R' is equal to {c7}{d7}, where M' is equal to ({c6, . . . , c0}*{d7}+{d6, . . . , d0}*{c7}), and where Y' is equal to {c6, . . . , c0}*{d6, . . . , d0}.

Computing Y' and Z' in equations (16) and (17) requires two 7-bit unsigned multiplications {a6, . . . , a0}* {b6, . . . , b0} and {c6, . . . , c0}*{d6, . . . ,d0}, which can be computed using an 18×18 multiplier configured as an unsigned multiplier together with some correction logic. FIG. 7A is a diagram showing the allocation of input bits for an unsigned 18×18 multiplier configured to perform the four 7×7 multiplications. As shown in FIG. 7A, the unsigned 18×18 multiplier has a first input P and a second input Q that are each capable of receiving up to 18 bits (i.e., from bit index 0 to 17). In particular, indices [17:11] of P are configured to receive {a6, . . . , a0}, indices [6:0] of P are configured to receive {c6, . . . , c0}, indices [17:11] of Q are configured to receive {b6, . . . , b0}, and indices [6:0) of Q are configured to receive {d6, . . . , d0}. The remaining indices [10:7] of P and Q are populated with zeroes.

The output O of the 18×18 multiplier will be equal to P*Q and has the following expression:

$$O=P*Q=(\{a6,\ldots,a0\}*2^{11}+\{c6,\ldots,c0\})*(\{b6,\ldots,b0\}*2^{11}+\{d6,\ldots,d0\})\{a6,\ldots,a0\}*\{b6,\ldots,b0\}*2^{22}+(\{a6,\ldots,a0\}*\{d6,\ldots,d0\}+\{c6,\ldots,c0\}*\{b6,\ldots,b0\})*2^{11}+\{c6,\ldots,c0\}*\{d6,\ldots,d0\}=Z'*2^{22}+X'*2^{11}+Y' \quad (18)$$

where X' is equal to ({a6, . . . , a0}*{d6, . . . , d0}+ {c6, . . . , c0}*{b6, . . . , b0}).

Terms Z' and Y' can be extracted from multiplier output O with some correction applied. The bottom bits of X' (i.e., {x2,x1,x0}) overlap with the top bits of Y' (i.e., {y13,y12, y11}, as shown in portion 700, so the top bits of Y' will have to be corrected. To correct the top bits of Y', bits {x2,x1,x0} may first be computed using soft logic. Thereafter, bits {y13,y12,y11} can be obtained as follows:

$$\{y13,y12,y11\}=\{o13,o12,11\}-\{x2,x1,x0\} \quad (19)$$

The entire Y' bits can then be assembled by concatenating {y13,y12,y11} obtained using equation (19) with {o10, . . . , o0}.

The four LSBs of Z' (i.e., bits {z3,z2,z1,z0}) may be polluted by the top four MSBs of X', as shown in overlapping region 702. To correct the bottom bits of Z', bits {z3,z2,z1,z0} may first be computed using soft logic. Thereafter, bits {z3, . . . , z0} may be compared to the results in the same output location {o25, . . . , o22} as follows:

$$\{o25,o24,o23,o22\}<?\{z3,z2,z1,z0\} \quad (20)$$

If {o25, . . . , o22} is less than {z3, . . . , z0}, then an overflow has occurred since we are concerned with the sum modulo 16. In such scenarios, an error bit E in bit index 26 will be set to "1". If {o25, . . . , o22} is greater than or equal to {z3, . . . , z0}, then there is no overflow, so error bit E in bit position 26 will be set to "0".

The remaining top bits of Z' can then be computed from the multiplier output as follows:

$$\{z13,\ldots,z4\}=\{o35,\ldots,o26\}-E \quad (21)$$

The full Z' bits can then be assembled by merging {z13, . . . , z4} obtained using equation (21) with {z3, . . . , z0} computed in soft logic. The example above where the LSBs of Z are corrected in accordance with equation (21) is merely illustrative. If desired, the LSBs of Z need not be corrected or might only be partially corrected while leaving a small amount of remainder error.

Figure 7B:
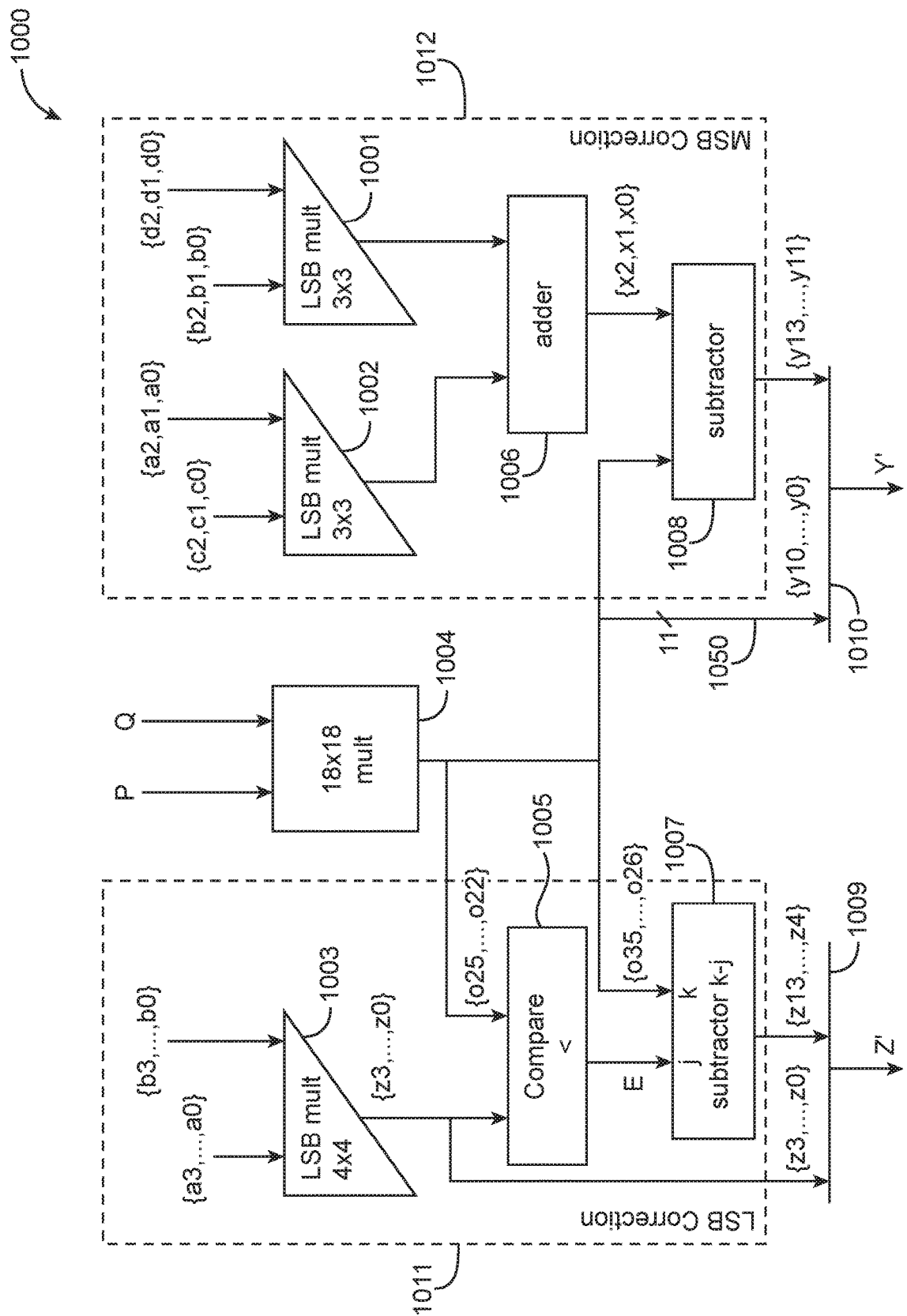
FIG. 7B is a diagram showing how the output bits of the 18×18 multiplier in FIG. 7A can be adjusted using least significant bit (LSB) correction logic and most significant bit (MSB) correction logic in accordance with an embodiment.

The circuit architecture for the portion of the multiplier circuitry for computing Y' and Z' is shown in FIG. 7B. As shown in FIG. 7B, multiplier circuitry 1000 may include 18×18 multiplier circuit 1004 configured to receive inputs P and Q (see, e.g., the allocation of bits in FIG. 7A) and to generated corresponding output bits {o35, . . . , o0}. The bottom 11 bits of Y' are directly available on the output as they coincide with {o10, . . . , o0}, as indicated by signal routing path 1050.

The top bits of Y' are recovered using MSB correction circuit 1012. MSB correction circuit 1012 may include partial LSB 3×3 multipliers 1001 and 1002, where multiplier 1002 is configured to compute only LSBs {c2,c1,c0}*{a2, a1,a0}[2:0] and where multiplier 1001 is configured to compute only LSBs {b2,b1,b0}*{d2,d1,d0}[2:0]. Adder circuit 1006 within circuit 1012 then sums least values together to produce {x2,x1,x0}. Lastly, circuit 1012 may also include a subtraction circuit 1008 that performs the operation of equation (19) to produce {y13,y12,y11}. A merging circuit 1010 can then merge the newly produced 3 MSBs of Y' with the routed bits {y10, . . . , y0}.

To generate Z', the error that has propagated through due to the overlap with X' needs to be fixed using LSB correction circuit 1011. LSB correction circuit 1011 may include partial LSB 4×4 multiplier 1003 configured to compute only LSBs {a3, . . . , a0}*{b3, . . . , b0}[3:0], thus yielding correct bits {z3, . . . , z0}. These bits can then be compared to {o25, . . . , o22} using comparison circuit 1005. If {o25, . . . , o22} is less than {z3, . . . , z0}, then an overflow has propagated into the upper bits of the multiplier and error bit E is set to one. Subtraction circuit 1007 can be used to subtract error bit E from {o35, . . . , o26} to produce {z13, . . . , z4} in accordance with equation (21). A merging circuit 1009 can then merge the newly produced MSBs of Z' with the LSBs {z3, . . . , z0} generated by circuit 1003. Alternatively, Z' may be created by first subtracting {z3, . . . , z0} from {o35, . . . , o22} and then replacing the bottom four bits of the difference with {z3, . . . , z0}.

Figure 7C:
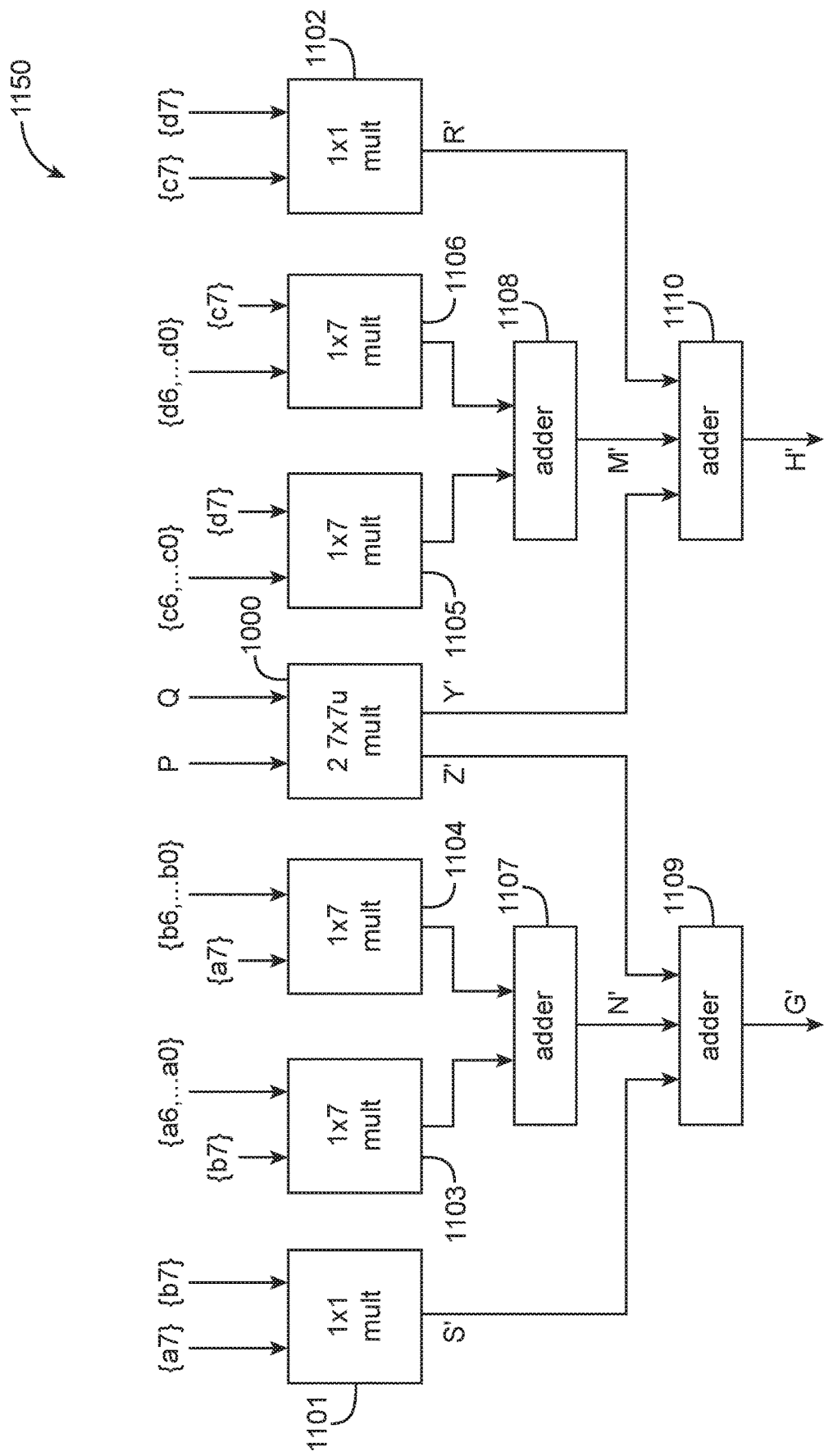
FIG. 7C is a diagram showing the overall architecture of the multiplier circuitry of the type shown in connection with FIGS. 7A-7B in accordance with an embodiment.
Figure 7D:
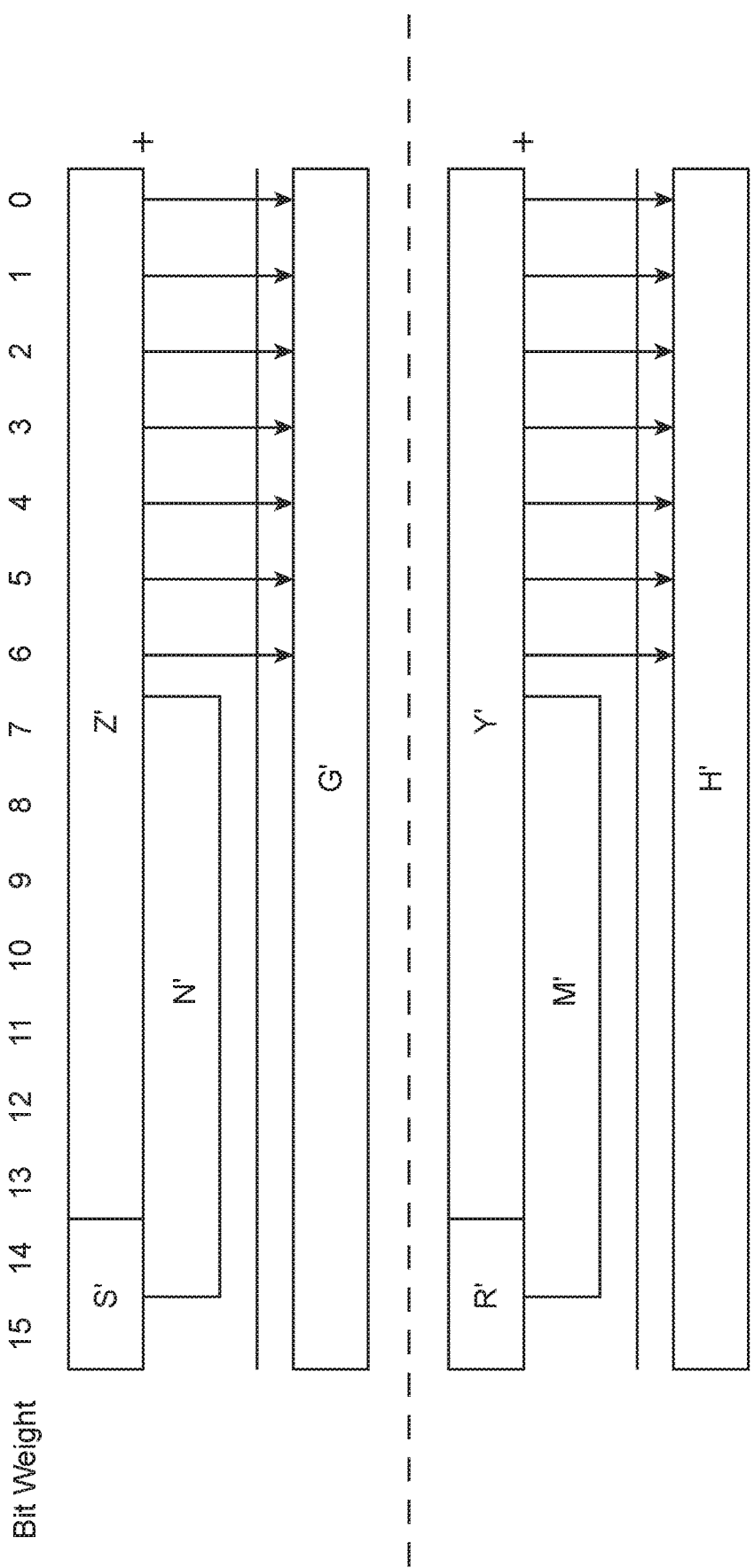
FIG. 7D is a diagram showing the alignment of additional shifted product terms that needs to be combined with the output of the 18×18 multiplier of FIGS. 7A-7C in accordance with an embodiment.

The full architecture of this type of multiplier circuitry that outputs G' and H' is shown in FIG. 7C. As shown in FIG. 7C, multiplier circuitry 1150 uses two 1×1 multipliers 1101 and 1102 to compute S' and R', respectively. Multipliers 1101 and 1102 are simple and may be replaced by logic AND gates in the final implementation (as an example).

The four 1×7 multiplier circuits 1103, 1104, 1105, and 1106 are also fairly simple and require only one level of compute logic. If A, B, C, and D are signed numbers, then {b7}*{a6, . . . , a0} will be 0 if {b7}=0, or –{a6, . . . , a0} if {b7}=1. Multipliers 1101, 1102, 1103, 1104, 1105, 1106 are sometimes referred to collectively as multiplier extension logic. If desired, 18×18 multiplier 1000 and the associated multiplier extension logic might both be signed or might both be unsigned.

Adder circuit 1107 that sums the results from circuits 1103 and 1104 and adder circuit 1108 that sums the results from circuits 1105 and 1106 will absorb the input logic since the 1× functions are relatively cheap and easy to implement using just a few logic gates (e.g., adders 1107 and 1108 can optionally absorb the input multipliers 1103-1106 by turning them into simple gates). The cost of circuits 1103, 1104, and 1107 will be equal to the cost of a ripple-carry adder required to generate N'. Similarly, the cost of circuits 1105, 1106, and 1108 will also be equal to the cost of a ripple-carry adder required to generate M'.

Adder circuit 1109 is configured to aggregate the weighted values S', N', and Z'. The two inputs S' and Z' can be concatenated into one operand {S',Z'} to which $N'*2^7$ is then added to yield G' (see, e.g., upper half of FIG. 7D). Therefore, the addition only spans the upper bits. Similarly, adder circuit 1110 is configured to aggregate the weighted values R', M', and Y'. The two inputs R' and Y' can be concatenated into one operand {R',Y'} to which $M'*2^7$ is then added to yield H' (see, e.g., lower half of FIG. 7D). Here, the addition also spans only the upper bits. If inputs A, B, C, and D are signed numbers, then N' and M' will require sign extension before circuits 1109 and 1110, respectively.

In accordance with yet another suitable embodiment, the 7×7 unsigned integer multiplier circuitry 1000 shown in FIG. 7B can be used to implement two 9×9 signed or unsigned multiplications. To compute G"=A*B and H"=C*D, where A, B, C, and D are each 9-bit signed or unsigned integers, inputs A, B, C, and D are each decomposed into two parts: an upper portion including 2 MSBs and a lower portion including the 7 LSBs. The product G"=A*B may be expressed as follows:

$$G"=(\{a8,a7\}2^7+\{a6,\ldots,a0\})*(\{b8,b7\}2^7+ \{b6,\ldots,b0\})=\{a8,a7\}\{b8,b7\}2=4+ (\{a6,\ldots,a0\}*\{b8,b7\}+\{b6,\ldots,b0\}*\{a8,a7\}) 2^7+\{a6,\ldots,a0\}*\{b6,\ldots,b0\}=S"*2^{14}+ N"*2^7+Z" \quad (22)$$

where S" is equal to {a8,a7}{b8,b7}, where N" is equal to ({a6, . . . , a0*b8,b7 b6, . . . ,b7}+b6, . . . ,b0*{a8,a7}, and where Z" is equal to {a6, . . . , a0}*{b6, . . . , b0}.

Similarly, the product H"=C*D can be expressed as follows:

$$H"=(\{c8,c7\}2^7+\{c6,\ldots,c0\})*(\{d8,d7\}2^7+ \{d6,\ldots,d0\})=\{c8,c7\}\{d8,d7\}2^{14}+ (\{c6,\ldots,c0\}*\{d8,d7\}+\{d6,\ldots,d0\}*\{c8,c7\}) 2^7+\{c6,\ldots,c0\}*\{d6,\ldots,d0\}=R"*2^{14}+ M"*2^7+Y" \quad (23)$$

where R" is equal to {c8,c7}{d8,d7}, where M" is equal to ({c6, . . . , c0}*{d8,d7}+{d6, . . . , d0}*{d8,c7}), and where Y" is equal to {c6, . . . , c0}*{d6, . . . , d0}.

Figure 8A:
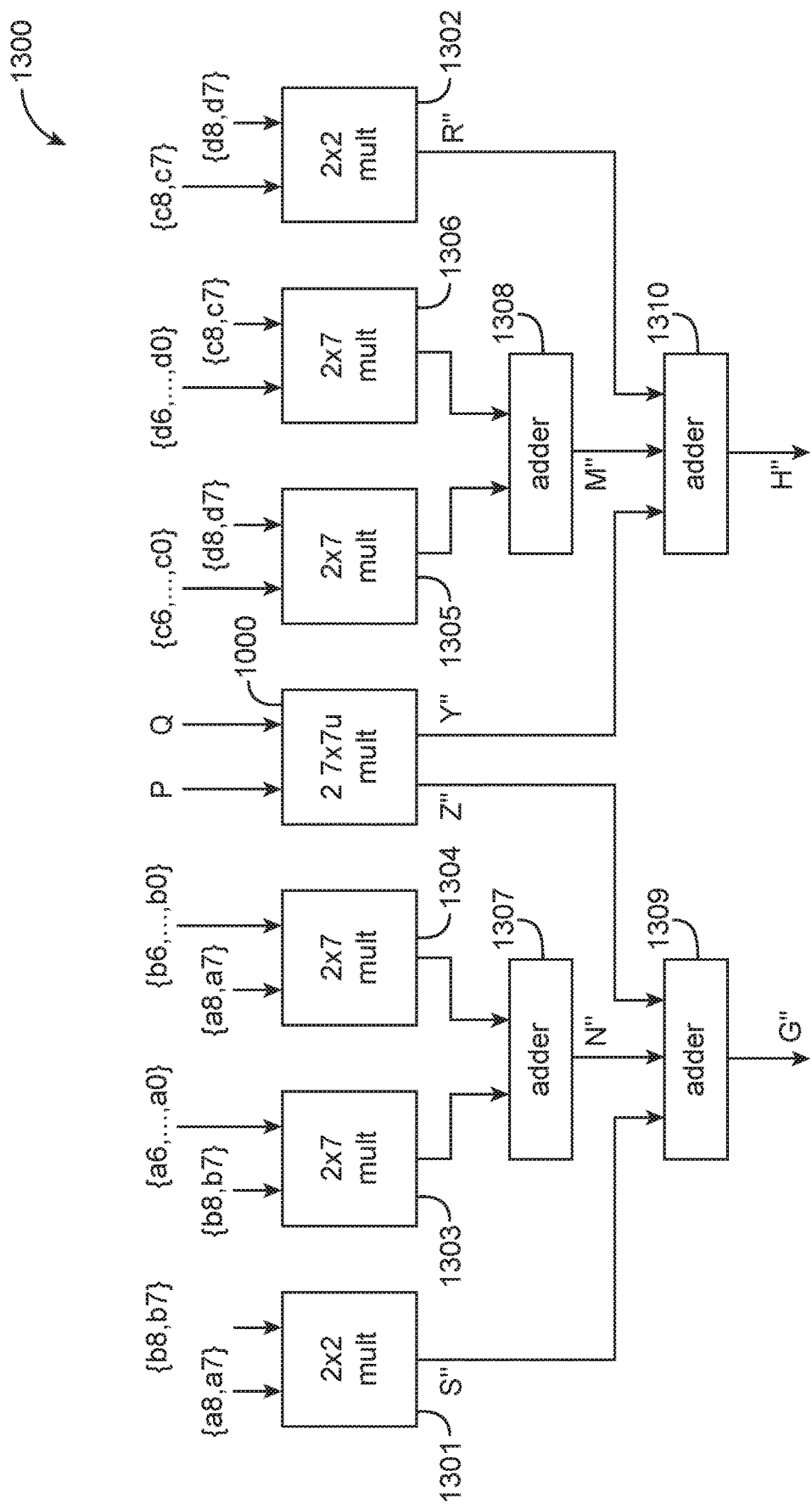
FIG. 8A is a diagram showing the overall architecture of multiplier circuitry that includes an 18×18 multiplier, which is configured to perform unsigned 7×7 multiplications, the output of which can be combined with bits generated from associated extension logic to support two 9×9 multiplications with no common input operands in accordance with an embodiment.

Multiplier circuitry 1000 of FIG. 7B can be used to compute Z" and Y". Multiplier circuitry 1300 in FIG. 8A may be used to assemble the final products G" and H". As shown in FIG. 8A, multiplier circuitry 1300 uses two 2×2 multipliers 1301 and 1302 to compute S" and R", respectively. Multipliers 1301 and 1302 are simple and may be implemented using lookup tables or other suitable logic (as an example).

The four 2×7 multiplier circuits 1303, 1304, 1305, and 1306 can be implemented as follows. For signed inputs A, B, C, and D the possible values of the product are {–2,–1,0, 1}*{7 bits}. For unsigned inputs A-D, the possible values of the product will be {0,1,2,3}*{7 bits}. These operations are fairly trivial and require at most one addition to implement. Multipliers 1301, 1302, 1303, 1304, 1305, 1306 are sometimes referred to collectively as multiplier extension logic. If desired, 18×18 multiplier 1000 and the associated multiplier extension logic might both be signed or might both be unsigned.

Figure 8B:
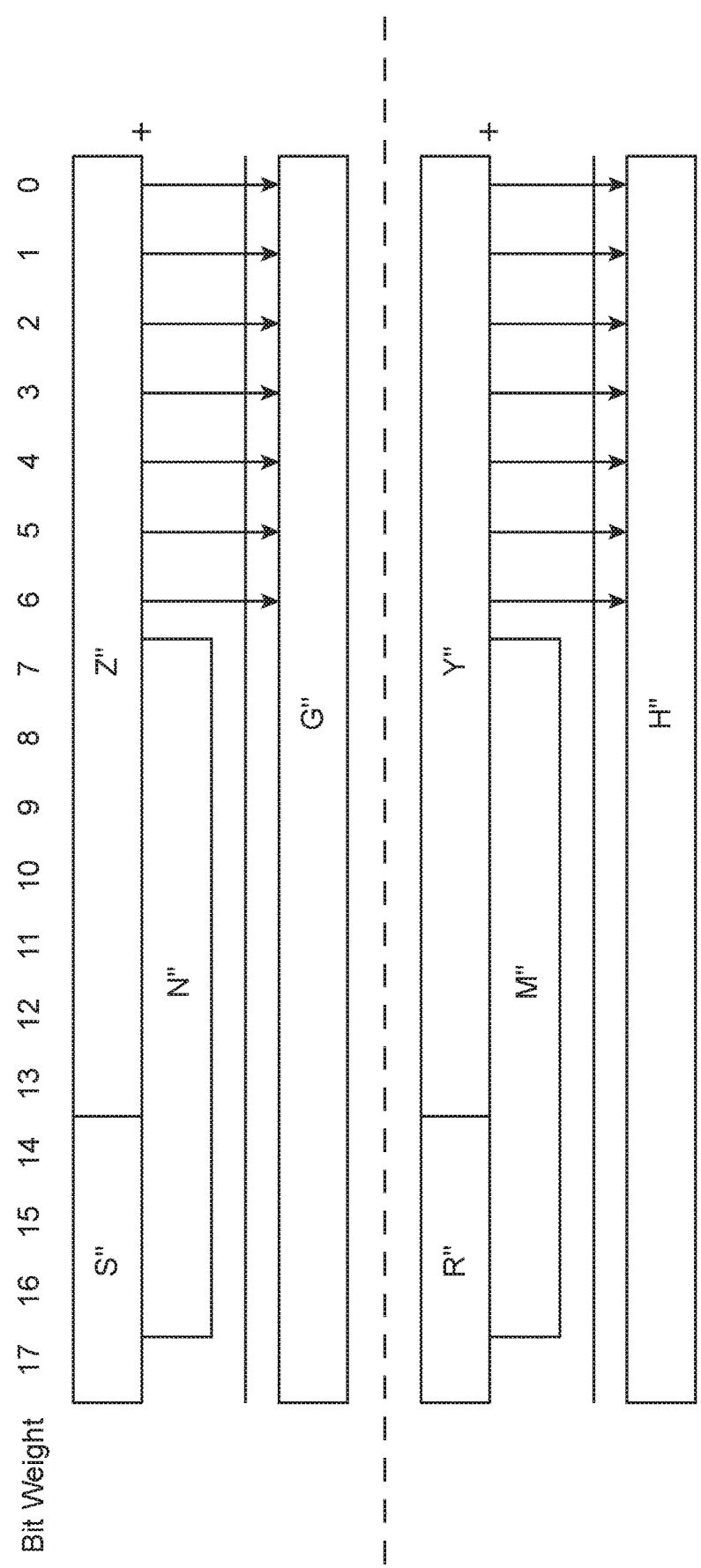
FIG. 8B is a diagram showing the alignment of additional shifted product terms that needs to be combined with the output of the 18×18 multiplier of FIG. 8A in accordance with an embodiment.

Adder circuit 1307 that sums the results from circuits 1303 and 1304 and adder circuit 1308 that sums the results from circuits 1305 and 1306 may be full-blown adders. Adder circuit 1309 is configured to aggregate the weighted values S", N", and Z". The two inputs S" and Z" can be concatenated into one operand {S",Z"} to which $N"*2^7$ is then added to yield G" (see, e.g., upper half of FIG. 8B). Therefore, the addition only spans the upper bits. Similarly, adder circuit 1310 is configured to aggregate the weighted values R", M", and Y". The two inputs R" and Y" can be concatenated into one operand (R",Y") to which $M"*2^7$ is then added to yield H"(see, e.g., lower half of FIG. 8B). Here, the addition also spans only the upper bits. If inputs A, B, C, and D are signed numbers, then N" and M" will require sign extension before circuits 1309 and 1310, respectively.

The techniques described herein for implementing two 8×8 or two 9×9 integer multipliers using one 18×18 multiplier with associated soft logic (e.g., to implement any necessary correction or the peripheral bit extension) are merely illustrative and are not intended to limit the scope of the present embodiments. If desired, these techniques may be applied to a multiplier block of any size, where two or more smaller multipliers can be extracted using optional bit correction circuitry and/or multiplier extension circuitry of the type described above in connection with FIGS. 4-8.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

EXAMPLES

The following examples pertain to further embodiments.

Example 1 is an integrated circuit, comprising: a multiplier circuit having a first input, a second input, and an output, wherein: a first sub-multiplier and a second sub-multiplier are extracted from the multiplier circuit; the first input of the multiplier circuit is configured to receive a first input operand for the first sub-multiplier and also a first input operand for the second sub-multiplier, wherein the first input operand for the first sub-multiplier and the first input operand for the second sub-multiplier are concatenated using one or more zeroes; the second input of the multiplier circuit is configured to receive a common input operand for the first and second sub-multipliers; the first input operand for the first sub-multiplier and the common input operand are used to generate a first logical multiplier product internal to the multiplier circuit; the first input operand for the second sub-multiplier and the common input operand are used to generate a second logical multiplier product internal to the multiplier circuit; the first logical multiplier product at least partially overlaps with the second logical multiplier product; and output bits are generated at the output of the multiplier circuit; and an additional multiplier circuit configured to compute a correction value, wherein the correction value is applied to the output bits to obtain final multiplier output values for the first and second sub-multipliers.

Example 2 is the integrated circuit of example 1, wherein the multiplier circuit is optionally unsigned, and wherein the first and second sub-multipliers are optionally unsigned.

Example 3 is the integrated circuit of example 1, wherein the second input that receives the common input operand is optionally signed.

Example 4 is the integrated circuit of example 3, wherein the first input of the multiplier circuit is optionally signed, but wherein the first input operand for the first sub-multiplier and the first input operand for the second sub-multiplier are optionally unsigned.

Example 5 is the integrated circuit of example 3, wherein the first input of the multiplier circuit is optionally unsigned, and wherein the first input operand for the first sub-multiplier and the first input operand for the second sub-multiplier are optionally unsigned.

Example 6 is the integrated circuit of example 3, wherein the first input of the multiplier circuit is optionally signed, wherein the first input operand for the first sub-multiplier is optionally signed, and wherein the first input operand for the second sub-multiplier is optionally unsigned.

Example 7 is the integrated circuit of any one of examples 1-6, wherein some error optionally still exists in the final multiplier output value for the first sub-multiplier even after the correction value has been applied.

Example 8 is the integrated circuit of any one of examples 1-7, wherein the additional multiplier circuit optionally comprises a partial least significant bit (LSB) multiplier circuit.

Example 9 is the integrated circuit of any one of examples 1-8, optionally further comprising a subtraction circuit configured to apply the correction value to the output bits to obtain the final multiplier output values for the first and second sub-multipliers.

Example 10 is an integrated circuit, comprising: a multiplier circuit having a first input, a second input, and an output, wherein: a first sub-multiplier and a second sub-multiplier are extracted from the multiplier circuit; the first input of the multiplier circuit is configured to receive a combined value based on a concatenation of a first input operand for the first sub-multiplier and a first input operand for the second sub-multiplier and a sign extension of the first input operand for the second sub-multiplier; the second input of the multiplier circuit is configured to receive a common input operand for the first and second sub-multipliers; and output bits are generated at the output of the multiplier circuit; and an additional multiplier circuit configured to compute a correction value, wherein the correction value is applied to the output bits to obtain final multiplier output values for the first and second sub-multipliers.

Example 11 is the integrated circuit of example 10, wherein the combined value is optionally equal to the sum of the concatenation and the sign extension of the first input operand for the second sub-multiplier.

Example 12 is the integrated circuit of example 10, wherein the combined value is optionally equal to the difference of the concatenation and the sign extension of the first input operand for the second sub-multiplier.

Example 13 is the integrated circuit of any one of examples 10-12, optionally further comprising a subtraction circuit configured to apply the correction value to the output bits to obtain the final multiplier output values for the first and second sub-multipliers, wherein at least one bit output from the subtraction circuit is fed back as an input.

Example 14 is an integrated circuit, comprising: a multiplier circuit having a first input, a second input, and an output, wherein: the multiplier circuit is used to support a first sub-multiplier and a second sub-multiplier; the first input is configured to receive a concatenation of a lower portion of a first input operand for the first sub-multiplier and a lower portion of a first input operand for the second sub-multiplier; the second input is configured to receive a concatenation of a lower portion of a second input operand for the first sub-multiplier and a lower portion of a second input operand for the second sub-multiplier; and output bits generated at the output of the multiplier circuit; multiplier extension logic configured to receive upper portions of the first and second input operands for the first sub-multiplier and upper portions of the first and second input operands for the second sub-multiplier; and adder circuits configured to combine the output bits with bits generated from the multiplier extension logic to obtain final multiplier output values for the first and second sub-multipliers.

Example 15 is the integrated circuit of example 14, optionally wherein: the lower portion of the first input operand for the first sub-multiplier and the lower portion of the second input operand for the first sub-multiplier are used to generate a first logical multiplier product; the lower portion of the first input operand for the first sub-multiplier and the lower portion of the second input operand for the second sub-multiplier are used to generate a second logical multiplier product; the lower portion of the first input operand for the second sub-multiplier and the lower portion of the second input operand for the first sub-multiplier are used to generate a third logical multiplier product; and the first logical multiplier product at least partially overlaps with the sum of the second and third logical multiplier products.

Example 16 is the integrated circuit of example 15, optionally further comprising a logic gate configured to generate at least one error bit to compensate for the overlap.

Example 17 is the integrated circuit of example 16, optionally further comprising a subtraction circuit configured to subtract the at least one error bit from a sum value generated by the adder circuits to obtain the final multiplier output value for the first sub-multiplier.

Example 18 is the integrated circuit of example 15, optionally further comprising: an additional multiplier configured to compute correct least significant bits (LSBs) in the final multiplier output value for the first sub-multiplier; a comparison circuit configured to compare the correct LSBs with a first portion of the output bits generated by the multiplier circuit; and a subtraction circuit configured to subtract an error bit from a second portion of the output bits in response to determining that the first portion of the output bits is less than the correct LSBs.

Example 19 is the integrated circuit of any one of examples 14-18, wherein the most significant bits in the final multiplier output value for the second sub-multiplier are optionally corrected, and wherein the least significant bits in the final multiplier output value for the first sub-multiplier are optionally not corrected.

Example 20 is the integrated circuit of any one of examples 14-19, wherein the least significant bits in the final multiplier output value for the first sub-multiplier are optionally partially corrected such that some error still exists in the final multiplier output value for the first sub-multiplier even after the correction.

Example 21 is the integrated circuit of any one of examples 14-20, wherein the multiplier circuit is optionally unsigned, and wherein the multiplier extension logic is also optionally unsigned.

Example 22 is the integrated circuit of any one of examples 14-20, wherein the multiplier circuit is optionally signed, and wherein the multiplier extension logic is also optionally signed.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
   a multiplier circuit having a first input, a second input, and an output, wherein:
      a first sub-multiplier and a second sub-multiplier are extracted from the multiplier circuit;
      the first input of the multiplier circuit is configured to receive a first input operand for the first sub-multiplier and also a first input operand for the second sub-multiplier, wherein the first input operand for the first sub-multiplier and the first input operand for the second sub-multiplier are concatenated using one or more zeroes;
      the second input of the multiplier circuit is configured to receive a common input operand for the first and second sub-multipliers;
      the first input operand for the first sub-multiplier and the common input operand are used to generate a first logical multiplier product internal to the multiplier circuit;
      the first input operand for the second sub-multiplier and the common input operand are used to generate a second logical multiplier product internal to the multiplier circuit;
      the first logical multiplier product at least partially overlaps with the second logical multiplier product; and
      output bits are generated at the output of the multiplier circuit; and
   an additional multiplier circuit configured to compute a correction value, wherein the correction value is applied to the output bits to obtain final multiplier output values for the first and second sub-multipliers.

2. The integrated circuit of claim 1, wherein the multiplier circuit is unsigned, and wherein the first and second sub-multipliers are unsigned.

3. The integrated circuit of claim 1, wherein the second input that receives the common input operand is signed.

4. The integrated circuit of claim 3, wherein the first input of the multiplier circuit is signed, but wherein the first input operand for the first sub-multiplier and the first input operand for the second sub-multiplier are unsigned.

5. The integrated circuit of claim 3, wherein the first input of the multiplier circuit is unsigned, and wherein the first input operand for the first sub-multiplier and the first input operand for the second sub-multiplier are unsigned.

6. The integrated circuit of claim 3, wherein the first input of the multiplier circuit is signed, wherein the first input operand for the first sub-multiplier is signed, and wherein the first input operand for the second sub-multiplier is unsigned.

7. The integrated circuit of claim 1, wherein some error still exists in the final multiplier output value for the first sub-multiplier even after the correction value has been applied.

8. The integrated circuit of claim 1, wherein the additional multiplier circuit comprises a partial least significant bit (LSB) multiplier circuit.

9. The integrated circuit of claim 1, further comprising a subtraction circuit configured to apply the correction value to the output bits to obtain the final multiplier output values for the first and second sub-multipliers.

10. An integrated circuit, comprising:
a multiplier circuit having a first input, a second input, and an output, wherein:
a first sub-multiplier and a second sub-multiplier are extracted from the multiplier circuit;
the first input of the multiplier circuit is configured to receive a combined value based on a concatenation of a first input operand for the first sub-multiplier and a first input operand for the second sub-multiplier and a sign extension of the first input operand for the second sub-multiplier;
the second input of the multiplier circuit is configured to receive a common input operand for the first and second sub-multipliers; and
output bits are generated at the output of the multiplier circuit; and
an additional multiplier circuit configured to compute a correction value, wherein the correction value is applied to the output bits to obtain final multiplier output values for the first and second sub-multipliers.

11. The integrated circuit of claim 10, wherein the combined value is equal to the sum of the concatenation and the sign extension of the first input operand for the second sub-multiplier.

12. The integrated circuit of claim 10, wherein the combined value is equal to the difference of the concatenation and the sign extension of the first input operand for the second sub-multiplier.

13. The integrated circuit of claim 10, further comprising a subtraction circuit configured to apply the correction value to the output bits to obtain the final multiplier output values for the first and second sub-multipliers, wherein at least one bit output from the subtraction circuit is fed back as an input.

14. An integrated circuit, comprising:
a multiplier circuit having a first input, a second input, and an output, wherein:
the multiplier circuit is used to support a first sub-multiplier and a second sub-multiplier;
the first input is configured to receive a concatenation of a lower portion of a first input operand for the first sub-multiplier and a lower portion of a first input operand for the second sub-multiplier;
the second input is configured to receive a concatenation of a lower portion of a second input operand for the first sub-multiplier and a lower portion of a second input operand for the second sub-multiplier; and
output bits generated at the output of the multiplier circuit;
multiplier extension logic configured to receive upper portions of the first and second input operands for the first sub-multiplier and upper portions of the first and second input operands for the second sub-multiplier; and
adder circuits configured to combine the output bits with bits generated from the multiplier extension logic to obtain final multiplier output values for the first and second sub-multipliers.

15. The integrated circuit of claim 14, wherein:
the lower portion of the first input operand for the first sub-multiplier and the lower portion of the second input operand for the first sub-multiplier are used to generate a first logical multiplier product;
the lower portion of the first input operand for the first sub-multiplier and the lower portion of the second input operand for the second sub-multiplier are used to generate a second logical multiplier product;
the lower portion of the first input operand for the second sub-multiplier and the lower portion of the second input operand for the first sub-multiplier are used to generate a third logical multiplier product; and
the first logical multiplier product at least partially overlaps with the sum of the second and third logical multiplier products.

16. The integrated circuit of claim 15, further comprising a logic gate configured to generate at least one error bit to compensate for the overlap.

17. The integrated circuit of claim 16, further comprising a subtraction circuit configured to subtract the at least one error bit from a sum value generated by the adder circuits to obtain the final multiplier output value for the first sub-multiplier.

18. The integrated circuit of claim 15, further comprising:
an additional multiplier configured to compute correct least significant bits (LSBs) in the final multiplier output value for the first sub-multiplier;
a comparison circuit configured to compare the correct LSBs with a first portion of the output bits generated by the multiplier circuit; and
a subtraction circuit configured to subtract an error bit from a second portion of the output bits in response to determining that the first portion of the output bits is less than the correct LSBs.

19. The integrated circuit of claim 14, wherein the most significant bits in the final multiplier output value for the second sub-multiplier are corrected, and wherein the least significant bits in the final multiplier output value for the first sub-multiplier are not corrected.

20. The integrated circuit of claim 14, wherein the least significant bits in the final multiplier output value for the first sub-multiplier are partially corrected such that some error still exists in the final multiplier output value for the first sub-multiplier even after the correction.

21. The integrated circuit of claim 14, wherein the multiplier circuit is unsigned, and wherein the multiplier extension logic is also unsigned.

22. The integrated circuit of claim 14, wherein the multiplier circuit is signed, and wherein the multiplier extension logic is also signed.

* * * * *